United States Patent
Jang et al.

(10) Patent No.: US 9,812,774 B2
(45) Date of Patent: *Nov. 7, 2017

(54) COMPOSITE SHEET FOR SHIELDING MAGNETIC FIELD AND ELECTROMAGNETIC WAVE, AND ANTENNA MODULE COMPRISING SAME

(71) Applicant: AMOSENSE CO., LTD., Cheonan-si (KR)

(72) Inventors: Kil Jae Jang, Seongnam-si (KR); Dong Hoon Lee, Yongin-si (KR); Ki Chul Kim, Incheon (KR)

(73) Assignee: AMOSENSE CO., LTD., Cheonan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/772,431

(22) PCT Filed: Mar. 5, 2014

(86) PCT No.: PCT/KR2014/001795
§ 371 (c)(1),
(2) Date: Oct. 5, 2015

(87) PCT Pub. No.: WO2014/137151
PCT Pub. Date: Sep. 12, 2014

(65) Prior Publication Data
US 2016/0064814 A1    Mar. 3, 2016

(30) Foreign Application Priority Data

Mar. 5, 2013  (KR) ........................ 10-2013-0023470
Mar. 5, 2014  (KR) ........................ 10-2014-0025828

(51) Int. Cl.
*H01F 1/34*     (2006.01)
*H01Q 1/52*     (2006.01)
(Continued)

(52) U.S. Cl.
CPC .............. *H01Q 1/526* (2013.01); *H01F 1/18* (2013.01); *H01F 1/34* (2013.01); *H01Q 7/04* (2013.01);
(Continued)

(58) Field of Classification Search
None
See application file for complete search history.

(56) References Cited

U.S. PATENT DOCUMENTS 5,639,989 A * 6/1997 Higgins, III .......... H01L 23/552
                                                    174/386
8,268,092 B2 * 9/2012 Yang ................ G06K 19/07771
                                                    148/120
(Continued)

FOREIGN PATENT DOCUMENTS

KR    1019990014133    2/1999
KR    1020010075197    8/2001
(Continued)

OTHER PUBLICATIONS

International Search Report—PCT/KR2014/001795 dated Jun. 17, 2014.

*Primary Examiner* — Kevin M Bernatz
(74) *Attorney, Agent, or Firm* — Cantor Colburn LLP

(57) ABSTRACT

Provided are a composite sheet for shielding a magnetic field and an electromagnetic wave, and an antenna module using the same, which can block influence of a magnetic field on a main body and a battery of a mobile terminal block device, and the like, and simultaneously shield an electromagnetic wave, by significantly reducing a loss due to an eddy current by flaking an amorphous ribbon sheet. The composite sheet includes: a magnetic sheet; and a conductor sheet stacked on the magnetic sheet for shielding an electromagnetic wave and radiating heat. The magnetic sheet includes: an amorphous ribbon sheet which is thermally treated, flaked, and (Continued)

then separated into a plurality of fine pieces; a protective film bonded to one side surface of the amorphous ribbon sheet; and an adhesive tape bonded to the other side surface of the amorphous ribbon sheet.

15 Claims, 12 Drawing Sheets

(51) Int. Cl.
*H01Q 7/04* (2006.01)
*H05K 9/00* (2006.01)
*H02J 7/02* (2016.01)
*H01F 1/18* (2006.01)
*H04B 5/00* (2006.01)

(52) U.S. Cl.
CPC ............ *H02J 7/025* (2013.01); *H05K 9/0075* (2013.01); *H01Q 1/521* (2013.01); *H04B 5/0037* (2013.01); *H04B 5/0081* (2013.01); *Y10T 428/32* (2015.01)

(56) References Cited

U.S. PATENT DOCUMENTS

| | | | | |
|---|---|---|---|---|
| 9,001,088 B2* | 4/2015 | Lee | ..................... | G06F 3/03545 178/18.01 |
| 9,252,611 B2* | 2/2016 | Lee | .................... | H01F 38/14 |
| 9,392,735 B2* | 7/2016 | Jang | ..................... | B32B 27/08 |
| 9,480,192 B2* | 10/2016 | Jang | ..................... | B32B 7/06 |
| 9,507,390 B2* | 11/2016 | Jang | ..................... | H05K 9/0075 |
| 9,578,792 B2* | 2/2017 | Jang | ..................... | H05K 9/0086 |
| 2004/0219328 A1* | 11/2004 | Tasaki | ..................... | C22C 30/00 428/692.1 |
| 2005/0003079 A1* | 1/2005 | Wakayama | ............. | B32B 27/36 427/129 |
| 2008/0070003 A1* | 3/2008 | Nakatani | .......... | G06K 19/07749 428/141 |
| 2009/0167623 A1* | 7/2009 | Tsujimura | ............ | H01Q 1/2225 343/787 |
| 2010/0052992 A1* | 3/2010 | Okamura | ............... | H01Q 1/526 343/700 MS |
| 2013/0202848 A1* | 8/2013 | Kim | ..................... | H01B 37/421 428/141 |
| 2014/0017486 A1* | 1/2014 | Yoo | ..................... | B29C 67/0011 428/325 |
| 2015/0123604 A1* | 5/2015 | Lee | ......................... | H01F 38/14 320/108 |
| 2015/0342099 A1* | 11/2015 | Jang | ...................... | H01Q 17/00 174/350 |
| 2016/0106012 A1* | 4/2016 | Jang | ..................... | H05K 9/0086 361/679.26 |

FOREIGN PATENT DOCUMENTS

| | | |
|---|---|---|
| KR | 100523313 | 10/2005 |
| KR | 100623518 | 9/2006 |
| KR | 1020090089277 | 8/2009 |
| KR | 101163574 | 7/2012 |
| KR | 1020130000743 | 1/2013 |
| KR | 1020130007954 | 1/2013 |
| WO | 2009085660 | 7/2009 |

* cited by examiner

COMPOSITE SHEET FOR SHIELDING MAGNETIC FIELD AND ELECTROMAGNETIC WAVE, AND ANTENNA MODULE COMPRISING SAME

TECHNICAL FIELD

The present invention relates to a composite sheet for shielding a magnetic field and an electromagnetic wave, and an antenna module including the same, in which effects of the magnetic field and the electromagnetic wave influencing upon a main body and a battery of a mobile terminal device can be blocked or shielded by greatly reducing a loss due to an eddy current by flake-processing an amorphous ribbon sheet.

BACKGROUND ART

Recently, various functions including RFID (Radio Frequency Identification such as wireless identification, NFC (Near Field Communication), a wireless charger, an interactive pen tablet and the like are added to wireless terminal devices including mobile phones and tablet PCs (Personal computers).

NFC means one of electronic tags such as RFID, and refers to a technique for transferring data between terminal devices in close range of 10 cm in a non-contact short-range wireless communication module using a frequency band 13.56 MHz. NFC is extensively used for mobile payment as well as a file transfer method of transferring goods information at a supermarket or general store, or travel information for visitors, traffic information, access control and locking devices, and the like.

In addition, according to the latest Google's announcement, the "Android Beam" equipped with smartphones provides the ability to transfer photos, business cards, files, maps, web sites, etc., as well as mobile payments, as NFC-based local area information transmission and reception functions, from one phone to a different phone.

RFID wireless environments are widely utilized for mobile terminal devices. For example, NFC chips realizing near field communications are mounted in mobile terminal devices, and non-contact smart cards such as USIM (Universal Subscriber Identity Module) cards are also mounted therein. When one of the mobile terminal devices having the NFC chips and the non-contact smart cards is made to access an external RF reader, information of the USIM card in the mobile terminal device is read through near field communications by the RF reader, and necessary information is recorded in the USIM card. By doing so, a built-in function such as an electronic money function is realized.

Information exchanges between the NFC chip and the RF reader are achieved by supplying power for driving the USIM card by an induced electromotive force at 13.56 MHz between a primary coil (or antenna) provided in the RF reader and a secondary coil (or antenna) of the NFC chip mounted in the mobile terminal device.

In general, a non-contact (wireless) charging antenna is mounted in a cover for a battery chamber of a mobile terminal device. Since a late charging circuit connected to an antenna gets small and thus is built in a main body of the mobile terminal device, only antenna parts remain in the battery chamber cover.

The NFC chip mounted in the mobile terminal device may also operate as the external RFID reader, and may be developed to read information recorded in RFID tags and the like. When the NFC chip operates as the RF reader, the antenna (or coil) connected to the NFC chip act as a primary coil to thus transmit power, and an induced electromotive force is generated from the secondary coil (or antenna) mounted in the external RFID tags or the like, to thus realize wireless communications.

That is, a loop antenna of a spiral coil form which can generate an induced electromotive force is needed in order to apply the RFID system or NFC system in the mobile terminal device, the NFC antenna is usually mounted in the battery chamber cover.

In this case, since the induced electromotive force induced in the loop antenna of the spiral coil form is determined by Faraday's law and Lenz's law, it is advantageous that the amount of magnetic flux interlinking with the secondary coil antenna gets large in order to obtain a high voltage signal. The amount of magnetic flux gets large as the amount of a soft magnetic material contained in the secondary coil antenna gets large, and the magnetic permeability of the soft magnetic material becomes high.

In addition, a magnetic field of 100 kHz to several tens of MHz is generated in the antenna coil provided in the mobile terminal device when performing the NFC function with a neighboring mobile terminal device.

Thus, a magnetic shield sheet is essentially used in a mobile terminal device having such an additional function in order to prevent heat generation caused by eddy currents on parts of the mobile terminal device (in particular, a battery) due to the magnetic field, and also to maximize performance of the additional function by focusing the magnetic field.

It is common to use a magnetic material such as an amorphous ribbon, a ferrite, or a polymer sheet containing a magnetic powder as a magnetic field shielding sheet. The magnetic field focusing effect for shielding the magnetic field and improving performance of the additional function may be significant in descending order of the magnetic permeability of an amorphous ribbon, a ferrite, or a polymer sheet containing a magnetic powder.

Korean Patent Registration No. 10-523313 proposed an absorber for a RFID antenna made of a magnetic sheet having a composition selected from the group consisting of Fe—Si—B, Fe—Si—B—Cu—Nb, Fe—Zr—B and Co—Fe—Si—B and including an amorphous alloy, an RFID antenna including the absorber, and an RFID device including the RFID antenna.

The Korean Patent Registration No. 10-523313 discloses a kind of a polymer sheet that is obtained by mixing amorphous alloy powders with a resin to then be made into a sheet form, and has a problem of a low magnetic permeability, that is, the inductance value of the sheet is below 10 µH.

Furthermore, Korean Patent Registration No. 10-623518 disclosed a magnetic sheet for RFID that is configured by laminating a first amorphous alloy ribbon between first and second magnetic sheet layers made of alloy powders including at least one kind of amorphous alloys in order to simplify the manufacturing process of the Korean Patent Registration No. 10-523313 and to increase the magnetic permeability, and compression molding the laminated multi-layer sheet by a rolling or pressing process in order to increase the relative density of the laminated sheet and simultaneously form micro-cracks in the first amorphous alloy ribbon, and an RFID antenna using the magnetic sheet for RFID.

In the Korean Patent Registration No. 10-623518, micro-cracks are formed in the first amorphous alloy ribbon by compression molding the laminated multi-layer sheet, but the micro-cracks have the limitation in lowering the magnetic resistance, to thereby cause a problem that losses due to the eddy current are not greatly reduced.

Meanwhile, a wireless charging antenna is installed in a battery pack of a mobile terminal device, together with an NFC antenna.

In this case, when the transmission rate from the primary side of a wireless charger becomes large, a coupling between adjacent transformers, as well as a defect due to heat generated from peripheral parts, tends to occur. That is, in the case of using a planar coil, the magnetic flux passing through the planar coil is connected to a substrate and the like within the device, and thus the inside of the device generates the heat by eddy currents caused by electromagnetic induction. As a result, large power cannot be transmitted, to thus cause a problem that it takes a long time when charging.

A power reception device of a conventional non-contact charging system is configured to have a magnetic body (or a magnetic sheet) of high magnetic permeability and a large volume arranged on a surface opposite to a primary coil, that is, on the surface of a secondary coil, in order to enhance a coupling for improving the power transmission efficiency, and to improve the shielding performance for heat generation control. According to this arrangement, problems arise in a manner that variation in the inductance of the primary coil is increased, and an operating condition of a resonance circuit is shifted from a resonance condition that can exhibit a sufficient effect according to a relative positional relationship between the magnetic body and the primary coil.

The NFC antenna that currently uses a frequency band of 13.56 MHz is implemented by using a ferrite sheet having a low dependency on frequency.

A ferrite sheet or a polymer sheet containing magnetic powders has rather low magnetic permeability when compared to an amorphous ribbon. In the case of improving the performance of such low magnetic permeability, the ferrite sheet or the polymer sheet becomes thick as compared to the thickness of the amorphous thin ribbon of several tens of μm thick, and thus it is difficult to cope with a trend of a terminal device that is thinned.

In addition, in the case of an amorphous ribbon of high magnetic permeability, the ribbon itself is a metal sheet and thus there is no burden on the thickness. However, problems arise in a manner that an application function is lowered, or a wireless charging efficiency is reduced and heat generation occurs, due to eddy current effects on a ribbon surface when an alternating-current magnetic field on frequency of 100 kHz used for power transmission is applied to the amorphous ribbon.

For the wireless charger, a transmitter for power transmission usually has a structure of employing permanent magnets to help align a receiver, in order to heighten efficiency of the charger at maximum. However, since a thin shielding sheet is magnetized (or saturated) by a direct-current magnetic field of the permanent magnets, performance falls or power transmission efficiency rapidly falls.

Accordingly, in order to exhibit shielding property without being affected by the permanent magnet in the prior art, the thickness of the shielding sheet should be very thick to 0.5 T or thicker. Desired power transmission efficiency can be maintained, only when the thickness of the shielding sheet is very thick to 0.5 T or thicker, to accordingly cause a great obstacle to slimming of a mobile terminal.

Since voltages induced in the NFC antenna and the secondary coil of the wireless charger are determined by Faraday's law and Lenz's law, it is advantageous that the amount of magnetic flux interlinking with the secondary coil gets large in order to obtain a high voltage signal. The amount of magnetic flux gets large as the amount of a soft magnetic material contained in the secondary coil gets large, and the magnetic permeability of the soft magnetic material becomes high. In particular, since NFC and wireless charging are essentially the power transmission by the non-contact, it is required that a magnetic field shielding sheet on which a secondary coil is mounted should be made of a high permeability magnetic material, in order to focus radio frequency electromagnetic waves created in a primary coil of a transmitter on the secondary coil of a receiver.

The conventional magnetic field shielding sheet for NFC and wireless charging does not provide a solution to decrease a heat generation problem due to shielding even with a thin film and to increase wireless charging efficiency. The present inventors have recognized that even if an amorphous ribbon is flake-processed, the inductance (or magnetic permeability) thereof is less reduced and the magnetic resistance thereof is significantly decreased, to accordingly increase a quality factor (Q) of the secondary coil and to reach the present invention.

DISCLOSURE

Technical Problem

To solve the above problems or defects, it is an object of the present invention to provide a composite sheet for shielding a magnetic field and an electromagnetic wave, and an antenna module including the same, in which an influence of a magnetic field and an electromagnetic wave influencing upon a main body and a battery of a mobile terminal device can be blocked or shielded by greatly reducing a loss due to eddy currents by a flake treatment process of an amorphous ribbon, and a communication distance and charging efficiency can be increased by increasing a quality factor (Q) of a secondary coil.

It is another object of the present invention to provide a composite sheet for shielding a magnetic field and an electromagnetic wave, in which gaps between fine pieces of an amorphous ribbon are filled with an adhesive by a compression laminating process after a flake treatment process of the amorphous ribbon, to thus prevent water penetration, and simultaneously the fine pieces are surrounded by the adhesive (or dielectric), to thus mutually isolate the fine pieces, to thereby promote the reduction in the eddy current and prevent shielding performance from falling.

It is still another object of the present invention to provide a composite sheet for shielding a magnetic field and an electromagnetic wave, and an antenna module including the same, which prevents a frequency variation width from increasing when mounting an NFC antenna in a battery pack, to thereby decrease a defective rate of the NFC antenna.

It is yet another object of the present invention to provide a composite sheet for shielding a magnetic field and an electromagnetic wave, and an antenna module including the same, in which a conductor sheet having an electromagnetic wave shielding function and a heat radiation function is provided on one side of the composite sheet, and a large number of fine pores provided in a shielding sheet act as a thermal barrier layer capable of trapping heat, to thereby perform all of an electromagnetic wave shielding function, a heat radiation function, and an insulation function.

It is a further object of the present invention to provide a composite sheet for shielding a magnetic field and an electromagnetic wave, and an antenna module including the same, in which thermal diffusion, heat capturing and electromagnetic wave and magnetic field shielding functions can be carried out with a single sheet, to then be implemented as an ultra-thin type.

It is a still further object of the present invention to provide a composite sheet for shielding a magnetic field and an electromagnetic wave, and an antenna module including the same, which can be used for NFC and wireless charging.

Technical Solution

To accomplish the above and other objects of the present invention, according to an aspect of the present invention, there is provided a composite sheet for shielding a magnetic field and an electromagnetic wave, the composite sheet comprising: a magnetic sheet for shielding a magnetic field; and a conductor sheet stacked on the magnetic sheet for shielding an electromagnetic wave and radiating heat, wherein the magnetic sheet comprises: an amorphous ribbon sheet which is thermally treated, flaked, and then separated into a plurality of fine pieces; a protective film bonded to one side surface of the amorphous ribbon sheet; and an adhesive tape bonded to the other side surface of the amorphous ribbon sheet.

According to another aspect of the present invention, there is provided a composite sheet for shielding a magnetic field and an electromagnetic wave, the composite sheet comprising: a first magnetic sheet having a first permeability; and a second magnetic sheet having a second permeability lower than the first permeability of the first magnetic sheet and that is laminated on the first magnetic sheet, wherein the first magnetic sheet is divided into a large number of fine pieces, the fine pieces are arranged on an identical plane, and a protective film and a double-sided tape are laminated on both sides of the first magnetic sheet, respectively, and wherein a portion of an adhesive included in the protective film and the double-sided tape is filled in gaps between the fine pieces.

According to still another aspect of the present invention, there is provided an antenna module comprising: an NFC (Near Field Communication) antenna made of a loop antenna on a substrate for transmitting and receiving an NFC signal; and a composite sheet that is laminated on the substrate and that shields a magnetic field and an electromagnetic wave.

According to yet another aspect of the present invention, there is provided an antenna module comprising: a dual-antenna including a wireless-charging secondary coil that is formed in a loop form on an inner side of a substrate and that receives a wireless-charging high frequency power signal transmitted from a transmitter of a wireless charger, and an NFC (Near Field Communication) antenna coil that is formed of a loop form on an outside of the substrate, and that transmits and receives an NFC high frequency signal; and a composite sheet that is laminated on the substrate and that shields a magnetic field and an electromagnetic wave.

According to still yet another aspect of the present invention, there is provided an antenna module comprising: an NFC and wireless-charging antenna including a single coil that is formed in a spiral pattern on a surface of a substrate and first to third terminal blocks extended from the coil, and that transmits and receives an NFC high frequency signal between the first terminal block and the second terminal block and that receives a wireless-charging high-frequency signal transmitted from a transmitter of a wireless charger between the third terminal block and the first or second terminal block; and a composite sheet that is laminated on the substrate and that shields a magnetic field and an electromagnetic wave.

Advantageous Effects

As described above, according to the present invention, an influence of a magnetic field and an electromagnetic wave influencing upon a main body and a battery of a mobile terminal device can be blocked or shielded by greatly reducing a loss due to eddy currents by a flake treatment process of an amorphous ribbon, and excellent power transmission efficiency can be achieved and a communication distance can be increased by increasing a quality factor (Q) of a secondary coil.

In addition, gaps between fine pieces of an amorphous ribbon are filled with an adhesive by a compression laminating process after a flake treatment process of the amorphous ribbon, to thus prevent water penetration, and simultaneously all surfaces of the fine pieces are surrounded by the adhesive (or dielectric), to thus mutually isolate the fine pieces, to thereby promote the reduction in the eddy current and prevent shielding performance from falling. Further, the moisture is penetrated and the amorphous ribbon is oxidized by surrounding all surfaces of the fine pieces with an adhesive (or dielectric), variation of the appearance of the amorphous ribbon and the properties thereof can be prevented from deteriorating.

Further, the present invention prevents a frequency variation width from increasing when mounting an NFC antenna in a battery pack, to thereby decrease a defective rate of the NFC antenna.

In the present invention, a conductor sheet having an excellent electrical conductivity and an excellent thermal conductivity is provided on one side of a composite sheet, to thus shield electromagnetic waves and achieve rapid spread of heat to be conducted locally, and a large number of fine pores provided in a shielding sheet act as a thermal barrier layer capable of trapping heat, by blocking convection of the conducted heat, to thereby perform all of an electromagnetic wave shielding function, a heat radiation function, and an insulation function.

As a result, a composite sheet according to the present invention can carry out thermal diffusion (thermal dispersion), heat capturing (heat insulation) and electromagnetic wave and magnetic field shielding functions with a single sheet, to then be implemented as an ultra-thin type.

BEST MODE

The above and other objects, features, and advantages of the present invention can be appreciated by the following description and will be understood more clearly by embodiment of the present invention. In addition, it will be appreciated that the objects and advantages of the present invention will be easily realized by means shown in the appended patent claims, and combinations thereof. Accordingly, the technical spirit of the present invention can be easily implemented by one of ordinary skill in the art.

Further, if it is determined that the detailed description of the known art related to the present invention makes the gist of the present invention unnecessarily obscure, a detailed description thereof will be omitted.

Figure 1:
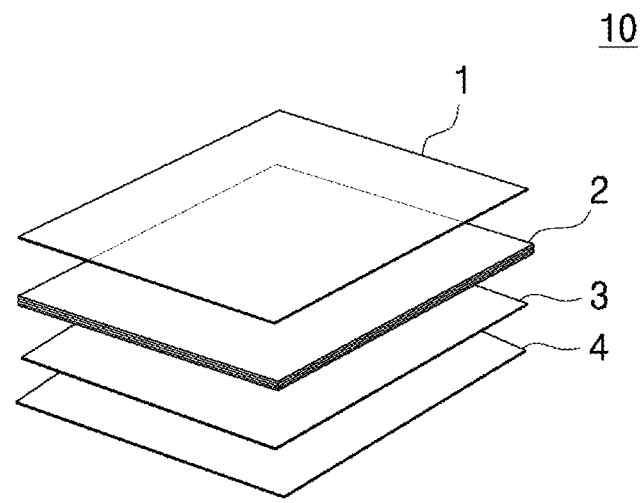
FIG. 1 is an exploded perspective view showing a magnetic field shield sheet for NFC (Near Field Communication) and wireless charging according to an embodiment of the present invention.
Figure 2:
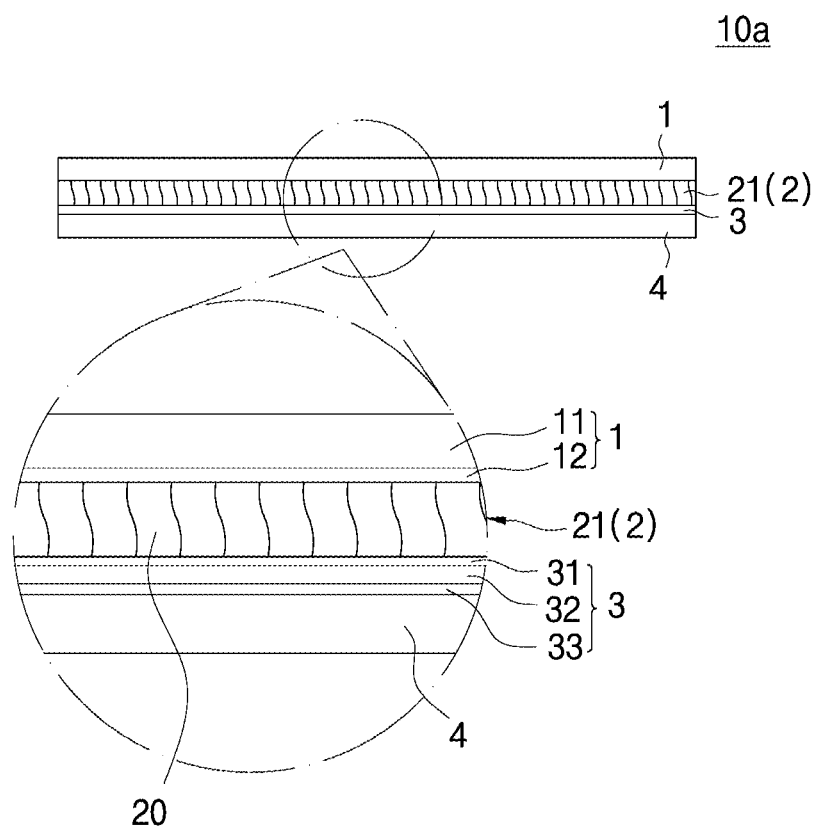
FIG. 2 is a cross-sectional view showing an example of using one piece of nanocrystalline ribbon sheet according to a first embodiment of the present invention.

FIG. 1 is an exploded perspective view showing a magnetic field shield sheet for NFC (Near Field Communication) and wireless charging according to an embodiment of the present invention. FIG. 2 is a cross-sectional view showing an example of using one piece of nanocrystalline ribbon sheet according to a first embodiment of the present invention.

Referring to FIGS. 1 and 2, a magnetic field shield sheet 10 for NFC and wireless charging according to a first embodiment of the present invention includes: at least one layer of thin magnetic sheet 2, by thermally treating an amorphous alloy or nanocrystalline alloy ribbon and then performing a flake treatment process to be separated and/or cracked into a plurality of fine pieces 20; a protective film 1 that is adhered on top of the thin magnetic sheet 2; a double-sided tape 3 that is adhered on a bottom of the thin magnetic sheet 2; and a release film 4 that is separably adhered on a lower surface of the double-sided tape 3.

The thin magnetic sheet 2 may include, for example, a thin ribbon made of an amorphous alloy or a nanocrystalline alloy.

The amorphous alloy may include a Fe-based or Co-based magnetic alloy, and may preferably include the Fe-based magnetic alloy, considering a material cost.

The Fe-based magnetic alloy may include, for example, an Fe—Si—B alloy, and may preferably include Fe of 70-90 atomic %, and a sum of Si and B of 10-30 atomic %. The higher the content of metal including Fe, the higher a saturation flux density becomes, but in the case that the content of Fe is excessive, it is difficult to form an amorphous alloy. Thus, in some embodiments of the present invention, it is preferable that the content of Fe should be in a range of 70-90 atomic %. In addition, the amorphous-forming capability of the alloy is the most excellent when the sum of Si and B is in the range of 10-30 atomic %. In order to prevent corrosion, a corrosion-resistant element such as Cr or Co may be added to the basic composition within 20 atomic %, a small amount of other metal elements may be also included in the basic composition as needed to impart different properties.

The Fe—Si—B alloy may have, for example, a crystallization temperature of 508° C., and a Curie temperature (Tc) of 399° C. However, the crystallization temperature can be varied depending on content of Si and B or the other metal elements to be added in addition to ternary alloy content and the content thereof.

In some embodiments of the present invention, a Fe—Si—B—Co-based alloy can be used as the Fe-based amorphous alloy, as needed.

Meanwhile, a thin ribbon made of a Fe-based nanocrystalline magnetic alloy can be used as the thin magnetic sheet 2.

An alloy satisfying the following Formula 1 is preferably used as the Fe-based nanocrystalline magnetic alloy.

$$Fe_{100-c-d-e-f-g-h}A_cD_dE_eSi_fB_gZ_h \qquad \text{Formula 1}$$

In Formula 1, an element A is at least one element selected from Cu and Au, an element D is at least one element selected from Ti, Zr, Hf, V, Nb, Ta, Cr, Mo, W, Ni, Co, and rare earth elements, an element E is at least one element selected from Mn, Al, Ga, Ge, In, Sn, and platinum group elements, an element Z is at least one element selected from C, N, and P, c, d, e, f, g, and h are numbers that satisfy the following relational expressions $0.01 \leq c \leq 8$ at %, $0.01 \leq d \leq 10$ at %, $0 \leq e \leq 10$ at %, $10 \leq f \leq 25$ at %, $3 \leq g \leq 12$ at %, $15 \leq f+g+h \leq 35$ at %, respectively, and the alloy structure of an area ratio of 20% or more is formed of the fine structure of the particle size of equal to or less than 50 nm.

In the aforementioned Formula 1, the element A is used to enhance corrosion resistance of the alloy, to prevent coarsening of crystal grains and at the same time, improve the magnetic properties such as the iron loss and the permeability of the alloy. When the content of the element A is too small, it is difficult to obtain the effect of suppressing coarsening of crystal grains. Conversely, when the content of the element A is excessively large, the magnetic properties are degraded. Thus, it is preferable that the content of the element A is in the range from 0.01 to 8 at %. The element D is an element that is effective for the uniformity of the crystal grain diameter, the reduction of magnetostriction, etc. It is preferable that the content of the element D is in the range from 0.01 to 10 at %.

The element E is effective for the soft magnetic properties of the alloy and improvement of corrosion resistance of the alloy. The content of the element E is preferably not more than 10 at %. The elements Si and B are elements that make the alloy to become amorphous at the time of producing the magnetic sheet. It is preferable that the content of the element Si is in the range from 10 to 25 at %, and it is preferable that the content of the element B is in the range from 3 to 12 at %. In addition, it may include the element Z as an element that makes the alloy to become amorphous, other than Si and B. In that case, the total content of the elements Si, B and Z is preferably in the range of 15 to 35 at %. It is preferable to implement the microcrystalline structure that crystal grains whose grain diameters are in the range of 5 to 30 nm exist in the range of 50 to 90% as an area ratio in the alloy structure.

Further, a Fe—Si—B—Cu—Nb alloy can be used as a Fe-based nanocrystalline magnetic alloy that is used in the thin magnetic sheet 2, and in this case, it is preferable that the content of Fe is 73-80 at %, the content of the sum of Si and B is 15-26 at %, and the content of the sum of Cu and Nb is 1-5 at %. An amorphous alloy that is obtained by producing such a composition range in the form of a ribbon can be easily precipitated into nanocrystalline grains by a thermal treatment to be described later.

Figure 4:
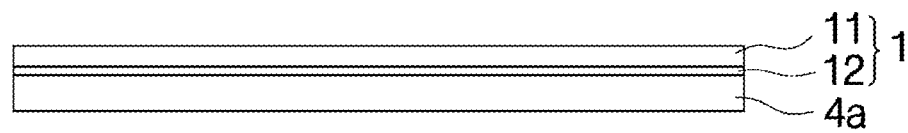
FIGS. 4 and 5 are cross-sectional views showing the structure of a protective film and a double-sided tape that are respectively used in the present invention.

As shown in FIG. 4, a protective film 1 may include a resin film 11 including a polyethylene terephthalate (PET) film, a polyimide film, a polyester film, polyphenylene sulfade (PPS) film, a polypropylene (PP) film, or a fluorine resin-based film such as poly terephthalate (PTFE). The protective film 1 is attached on one side of the thin magnetic sheet 2 by means of a first adhesive layer 12 is attached to one side of the protective film 1.

Further, the protective film 1 is 1 to 100 μm, in thickness, and it is preferably in the range of 10-30 μm, and it is more preferable to have a thickness of 20 μm.

In addition, when the protection film 1 that is used in an embodiment of the present invention is attached on one side of the thin magnetic sheet 2, a release film 4a attached on the other surface of the first adhesive layer 12 to protect the first adhesive layer 12 is removed and then the protection film 1 is attached on one side of the thin magnetic sheet 2.

Figure 5:
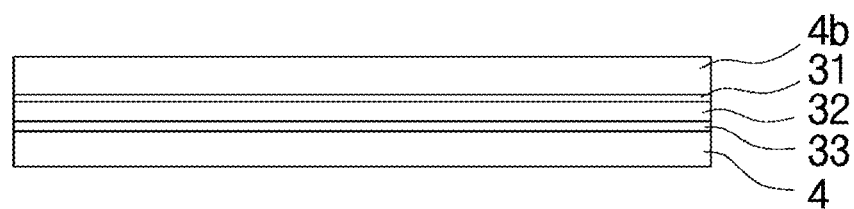

Further, as shown in FIG. 5, the double-sided tape 3 of FIG. 2 is formed of a base member 32 made of a fluorine resin-based film, for example, a PET (Polyethylene Terephthalate) film, on both sides of which second and third adhesive layers 31 and 33 are formed. Release films 4b and 4 are attached on the outer surfaces of the second and third adhesive layers 31 and 33, respectively, in order to protect the second and third adhesive layers 31 and 33. The release films 4b and 4 are formed integrally at the time of manufacturing the double-sided tape 3, and peeled off to then be removed when the shield sheet 10 is attached on a front or rear cover of a battery chamber in an electronic device.

Figure 3:
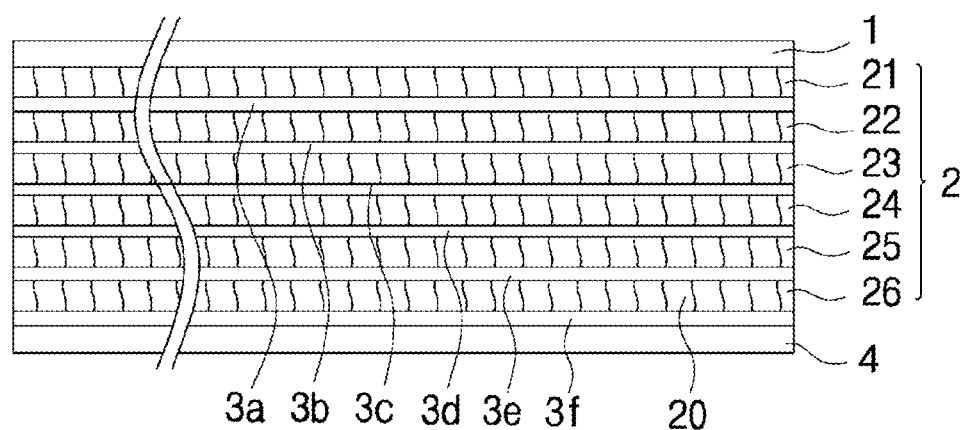
FIG. 3 is a cross-sectional view showing an example of using six pieces of nanocrystalline ribbon sheets according to a second embodiment of the present invention.

In the case of a magnetic field shield sheet for NFC and wireless charging according to a second embodiment shown in FIG. 3, release films 4 and 4b are removed from both sides of a double-sided tape 3a, 3b, 3c, 3d, or 3e that are respectively interposed between the neighboring ribbon sheets 21 and 22; 22 and 23; 23 and 24; 24 and 25; and 25 and 26 from among the ribbon sheets 21-26, and from both sides of a double-sided tape 3f that is attached on the other surface of the ribbon sheet 26 in order to interconnect a plurality of ribbon sheets 21-26 used as the multi-layer thin magnetic sheet 2.

The double-sided tapes 3, and 3a to 3f may be a type of including a base member as described above, but may be a type of including no base member but being formed of only adhesive layers. In the case of the double-sided tapes 3a to 3e interposed between the ribbon sheets 21-26, it is preferable to use no-base type double-sided tapes in terms of a thinning process.

The first to third adhesive layers 12, 31 and 33 may be implemented by using, for example, acrylic adhesives, but may be of course possibly implemented by using different types of adhesives.

The double-sided tapes 3, 3a to 3f may have 10, 20, 30 μm thick, preferably have a thickness of 10 μm.

One piece of the thin magnetic sheet 2 that is used for the shield sheet 10 may have a thickness of 15 to 35 μm for example. In this case, in consideration of a handling process after the heat treatment of the thin magnetic sheet 2, a thickness of the thin magnetic sheet 2 is preferably set to be in the range of 25 to 30 μm. The thinner the thickness of the ribbon sheet may become, a breakage phenomenon of the ribbon sheet may occur due to even a little shock at the time of performing a handling process after the heat treatment.

Figure 17:
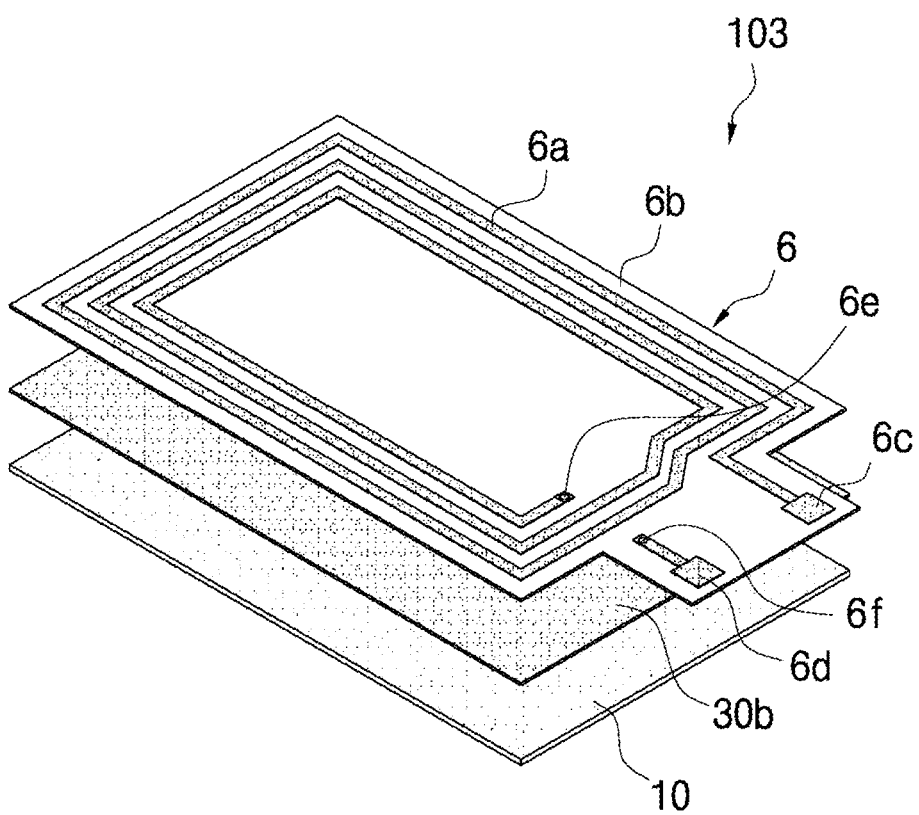
FIG. 17 is an exploded perspective view showing a structure of an NFC antenna module according to an embodiment of the present invention.

As shown in FIG. 17, the magnetic field shield sheet 10 is used so that an NFC antenna 6 is attached to the shielding sheet 10 by using a double-sided tape 30b.

Figure 19:
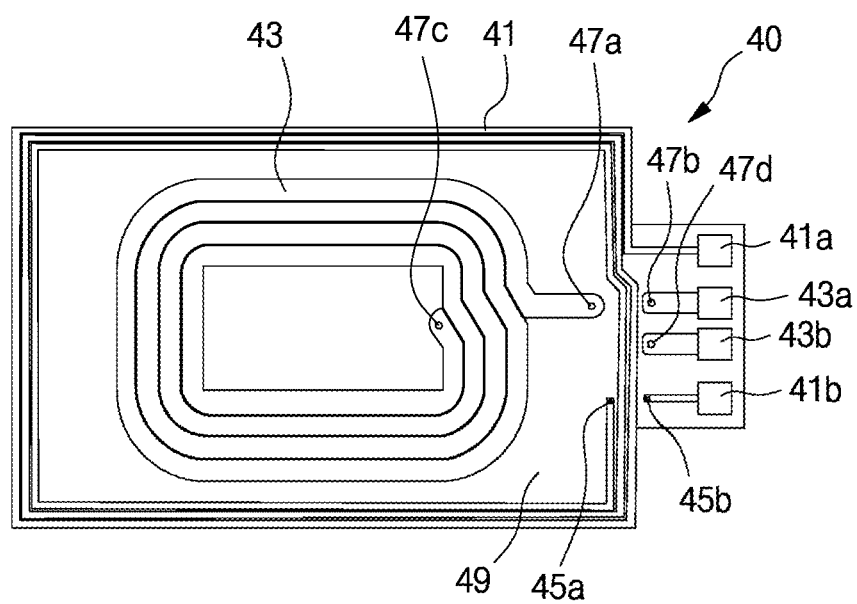
FIG. 19 is a plan view showing a dual antenna structure in which an NFC antenna and an antenna for wireless charging according to an embodiment of the present invention are formed on a single FPCB Flexible Printed Circuit Board).
Figure 20A:
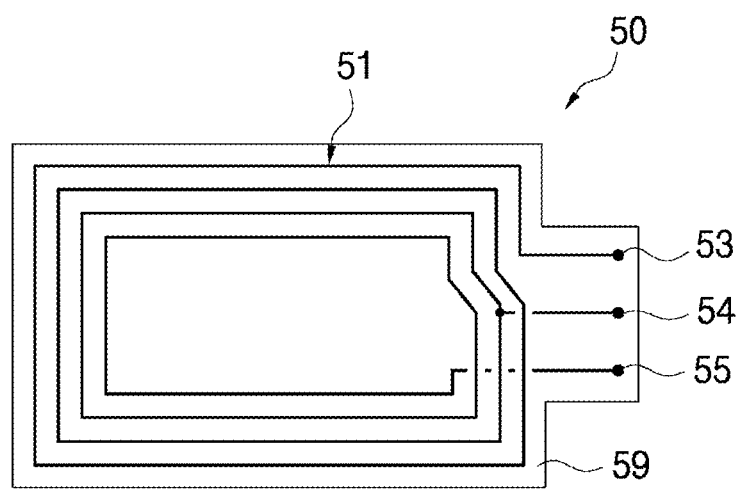
FIGS. 20A and 20B are a plan view and an equivalent circuit diagram respectively showing a structure of implementing an integral antenna for NFC and wireless charging by using a single coil in a single FPCB according to an embodiment of the present invention.
Figure 20B:
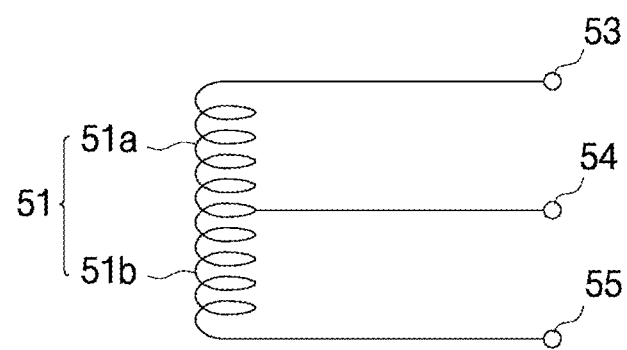

In addition, the magnetic field shield sheet 10 may be used in conjunction with a dual-antenna 40 or 50 for NFC and wireless charging as shown in FIGS. 19 and 20B.

As shown in FIG. 19, since a secondary coil of the dual-antenna 40 for NFC and wireless charging, i.e., an antenna coil 43 forms a resonance circuit, during wireless charging, the shield sheet 10 influences upon the inductance of the resonant circuit formed by the secondary coil 43.

The shield sheet 10 plays a role of shielding the magnetic field to block influences upon a mobile terminal device 101 (of FIG. 18, for example), by a wireless power signal of, for example, 300 kHz from a transmission device, and simultaneously serves as an inductor for inducing the wireless power signal to be received by a secondary coil 43 of a receiving device with high efficiency.

In general, when a mobile terminal device having a built-in NFC chip is accessed on an external RF reader, an NFC high-frequency signal of 13.56 MHz is applied from a primary coil (or antenna) installed in the RF reader, and accordingly an induced electromotive force is generated in a coil (or antenna) of the NFC chip in the mobile terminal device. Power for driving a USIM (Universal Subscriber Identity Module) card is supplied by the induced electromotive force. Accordingly, the information of the USIM card in the mobile terminal device is read by the RF reader to then record necessary information, by short-range wireless communications. As a result, for example, an electronic monetary function is realized.

When NFC is achieved, the magnetic field shield sheet 10 plays a role of shielding the magnetic field to block influences upon a mobile terminal device 101 (of FIG. 18, for example), by a high-frequency signal for NFC of 13.56 MHz generated from the primary coil (or antenna) installed in the RF reader, and simultaneously serves as an inductor for inducing the high-frequency signal for NFC to be received by the NFC antenna 6 with high efficiency.

As shown in FIGS. 2 and 3, the thin magnetic sheet 2 is divided and separated into a number of fine pieces 20 by a flake treatment process, and each of the fine pieces 20 preferably has a size of from several tens of μm to 3 mm.

When the thin magnetic sheet 2 is divided into a plurality of fine pieces 20 by the flake treatment process, the reduction of the magnetic Reluctance® is made larger than that of the inductance (L) of the magnetic sheet. As a result, when the thin magnetic sheet 2 is flake-treated, the quality factors (Q) of a resonance circuit formed by the NFC antenna coil 6a (of FIG. 17, for example) in a communication system such as NFC, and a resonance circuit formed by a secondary coil of a receiving device during wireless charging increase to thus increase the power transmission efficiency.

In addition, when the thin magnetic sheet 2 is divided into a large number of fine pieces 20, the losses due to eddy currents are reduced, to thus block the heat generation problem of the battery.

Figure 10:
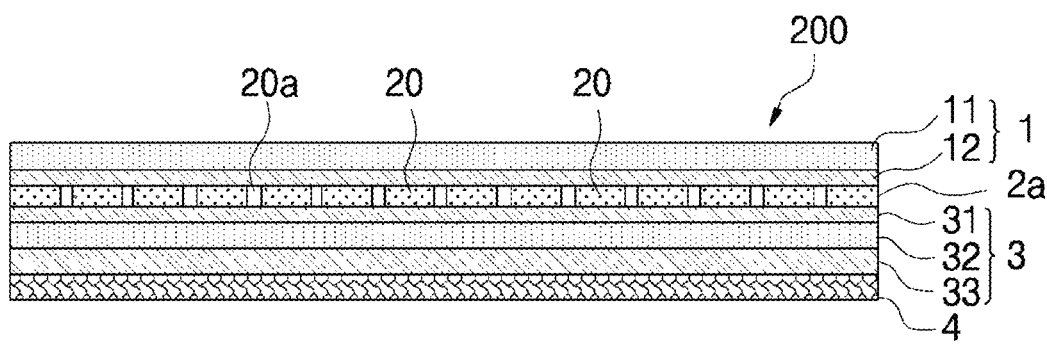
FIG. 10 is a cross-sectional view showing a state where a laminate sheet is flake-treated according to an embodiment of the present invention.
Figure 13:
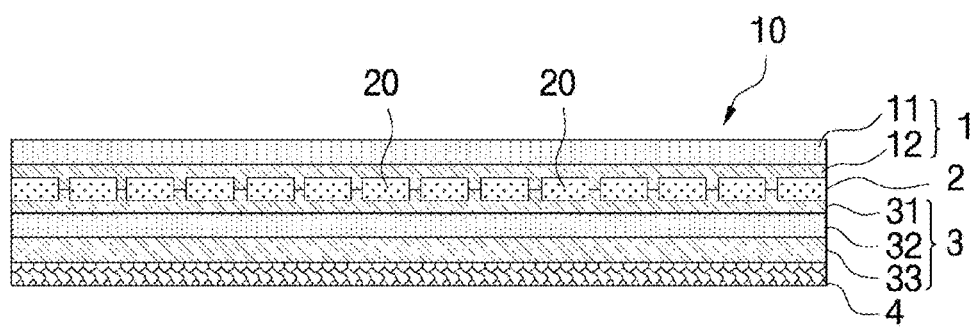
FIG. 13 is a cross-sectional view showing a state where a magnetic field shield sheet for NFC and wireless charging according to a first embodiment of the present invention has been flake-treated and then laminated.

Furthermore, in some embodiment of the present invention, since the thin magnetic sheet 2 is flake-treated by a flake treatment process as shown in FIG. 10, and then is laminated by a lamination process as shown in FIG. 13, portions of the first and second adhesive layers 12 and 31 are penetrated into gaps 20a between the large number of fine pieces 20. Thus, the large number of fine pieces 20 are separated by the first and second adhesive layers 12 and 31 playing a dielectric role.

As a result, only when the thin magnetic sheet 2 is simply flake-treated, the fine pieces 20 may contact one another according to the flow of the fine pieces 20, and thus the sizes of the fine pieces 20 may increase, to thereby cause a problem of generating an eddy current loss. However, since the fine pieces 20 are surrounded by the dielectric by the lamination process, the problem of generating an eddy current loss may be prevented.

As shown in FIG. 2, the magnetic shield sheet 10a for NFC and wireless charging according to the first embodiment of the present invention includes a single sheet of ribbon sheet 21 as the thin magnetic sheet 2, a protective film 1 that is bonded on one side of the thin magnetic sheet 2, and a release film 4 that is bonded on the other side of the thin magnetic sheet 2 via a double-sided tape 3.

In addition, the magnetic field shield sheet 10b shown in FIG. 3 according to the second embodiment of the present invention includes a plurality of ribbon sheets 21-26 as the thin magnetic sheet 2 in order to increase the quality factor (Q) of the secondary coil 43 of the receiving device and the power transmission efficiency. In addition, a protective film 1 is bonded on one side of the thin magnetic sheet 2, and a release film 4 is bonded on the other side of the thin magnetic sheet 2 via a double-sided tape 3f.

The wireless charger may employ a permanent magnet in a power transmission device to help align with a receiving device to ensure efficiency of the charger as great as possible. In other words, the circular permanent magnet is provided in the inside of a primary coil (or a transmitting coil) of the transmission device, to thereby achieve correct positioning with the receiving device to be placed on the transmission device and hold fast the receiving device.

Accordingly, the magnetic field shield sheet 100 for wireless charging is required to shield both an alternating-current (AC) magnetic field generated according to the power transmission of a frequency of 100 to 150 kHz (or 300 kHz) from the transmission device, as well as even a direct-current (DC) magnetic field by the permanent magnet.

By the way, the DC magnetic field influences upon the magnetic field shield sheet 10 more greatly than the AC magnetic field, and thus magnetically saturates the thin shield sheet to thereby cause a problem of lowering performance as the shield sheet or reducing the power transmission efficiency sharply.

Thus, when employing the permanent magnet in the transmission device of the wireless charger, it is required to determine the number of the ribbon sheets 21-26 to be laminated, taking into account the number of layers undergoing magnetic saturation by the permanent magnet.

In addition, the Fe-based amorphous alloy is greater than the nanocrystalline alloy, in view of the saturation magnetic field. Accordingly, when using a plurality of ribbon sheets 21-26 made of the Fe-based amorphous alloy, two (2) to eight (8) layers of the amorphous ribbon sheets can be laminated and used. For example, it is preferable to use three (3) to five (5) layers of the amorphous ribbon sheets because the high permeability can be obtained. In this case, the inductance (that is, the magnetic permeability) of the laminated sheet is preferably about 13 to 19 μH.

In the case of using a plurality of ribbon sheets 21-26 made of a nanocrystalline alloy, four (4) to twelve (12) layers of the ribbon sheets can be laminated and used. For example, it is preferable to use seven (7) to nine (9) layers of the ribbon sheets because the high permeability can be obtained. In this case, the inductance (that is, the magnetic permeability) of the laminated sheet is preferably about 13 to 21 μH.

Meanwhile, when no permanent magnet is employed in the transmission device in the wireless charger, it is also possible to use a relatively small number of the ribbon sheets compared to in the case of employing a permanent magnet.

In this case, when using a ribbon sheet made of a Fe-based amorphous alloy or a nanocrystalline alloy, one (1) to four (4) layers of the ribbon sheets can be laminated and used, and the inductance (that is, the magnetic permeability) of the laminated sheet is preferably about 13 to 21 μH.

Referring to FIG. 3, the magnetic field shield sheet 10b according to the second embodiment, includes a plurality of, for example, six laminated layers of ribbon sheets 21-26, in which a plurality of adhesive layers or double-sided tapes 3a-3e are inserted between the ribbon sheets 21-26.

That is, it is necessary to insert the adhesive layers or double-sided tapes 3a-3e between the ribbon sheets 21-26, so that portions of the adhesive layers or double-sided tapes 3a-3e are filled into gaps 20a to maintain the separated positions of the fine pieces 20 separated in the flake-treatment and lamination processes.

The magnetic field shield sheet 10, 10a and 10b according to the embodiments of the present invention are generally formed of a rectangle such as a rectangular shape or a square shape which corresponds to a battery cell, but may be formed of a polygonal such as a pentagonal shape, a circular or oval shape, or a combination of a rectangular shape with a circular shape in part. The magnetic field shield sheet 10, 10a and 10b may have preferably shapes corresponding to those of regions where the magnetic field shields are required.

Figure 6:
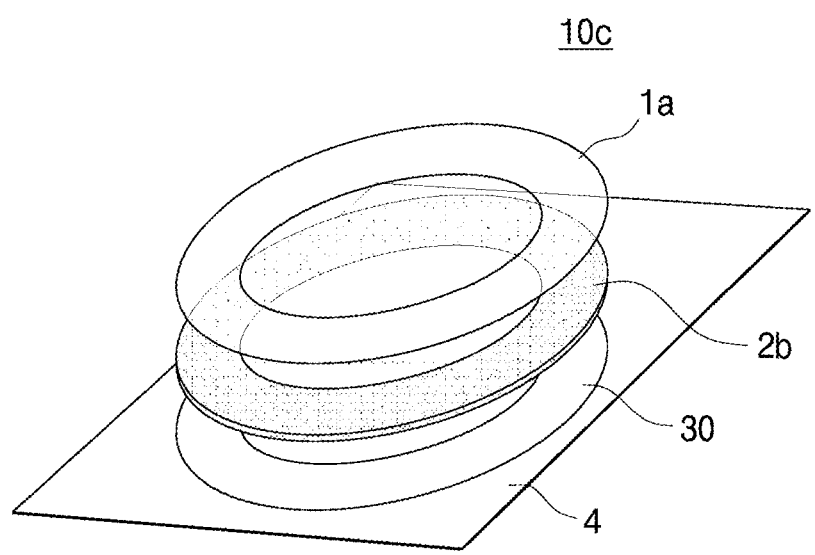
FIG. 6 is an exploded perspective view showing a magnetic field shield sheet for NFC and wireless charging according to a third embodiment of the present invention.

In addition, when a wireless charger contains a permanent magnet at the center of a primary coil of a transmission device, the magnetic field shield sheet according to an embodiment of the present invention may be formed of an annular shape corresponding to a secondary coil 43 of a receiving device, for example, as in the magnetic field shield sheet 10c according to a third embodiment as shown in FIG. 6, in order to prevent a phenomenon in which the magnetic field shield sheet is magnetized (or saturated) by the magnetic field of the permanent magnet.

The magnetic field shield sheet 10c according to the third embodiment is formed of a rectangular shape, a circular shape, or an oval shape, in correspondence to the case where the secondary coil 43 of the receiving device is formed of the rectangular shape, the circular shape, or the oval shape. In this case, the magnetic field shield sheet 10c is preferably made of a width wider by about 1-2 mm than the secondary coil 43.

The magnetic field shield sheet 10c according to the third embodiment may have a structure that an annular thin magnetic sheet 2b is attached to a release film 4 through an annular double-sided tape 30, in which an annular protective film 1a is attached on the upper surface of the annular thin magnetic sheet 2b.

The annular magnetic field shield sheet 10c preferably employs the release film 4 of a rectangular shape having an area greater than the magnetic field shield sheet 10c so as to be easily peeled off from the release film 4.

Figure 7:
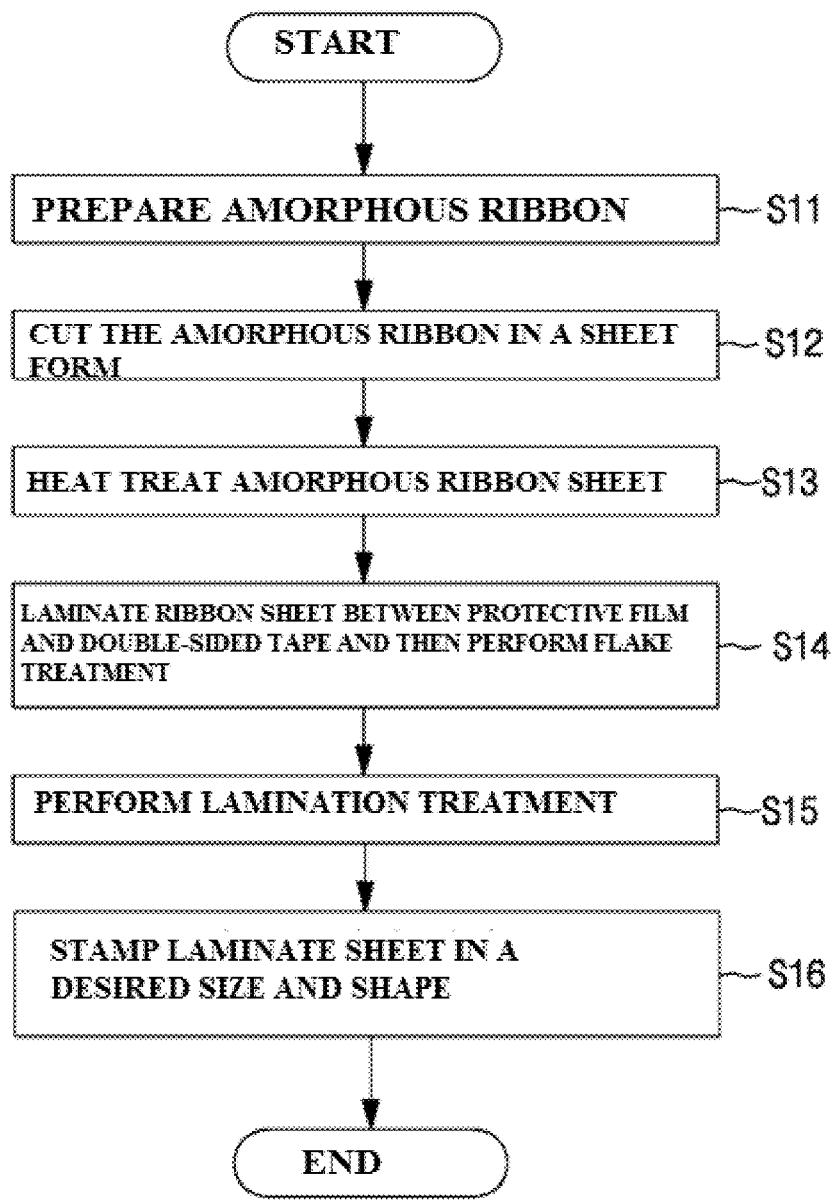
FIG. 7 is a flowchart view for explaining a process of producing a magnetic field shield sheet for NFC and wireless charging according to an embodiment of the present invention.

Hereinafter, a method of manufacturing a magnetic field shield sheet according to the embodiment of the present invention, will be described with reference to FIG. 7.

First, an amorphous alloy is prepared by a rapidly solidification process (RSP) due to melt spinning (S11), and is cut in a predetermined length to then be laminated in the form of a plurality of amorphous ribbon sheets (S12) so that post-processing after a heat treatment can be easily performed.

An amorphous ribbon equal to or less than 30 μm made of a Fe-based amorphous ribbon, e.g., a Fe—Si—B or Fe—Si—B—Co alloy is prepared by a rapidly solidification process (RSP) due to melt spinning. Then, the amorphous ribbon sheet is heat treated under no magnetic field environment, at a temperature of 300° C. to 600° C. for 30 minutes to 2 hours thereby obtaining a desired permeability (S13).

In this case, the heat treatment atmosphere happens in the temperature range where oxidation does not occur, even if the Fe content of the amorphous ribbon becomes high. Accordingly, the heat treatment atmosphere is not necessary to be made in an atmosphere furnace and the heat treatment can proceed in the air. Further, even if the heat treatment is achieved in an oxidizing atmosphere or a nitrogen atmosphere, there is no substantial difference in the magnetic permeability of the amorphous ribbon under an identical condition.

In the case that the heat treatment temperature is less than 300° C., a permeability higher than a desired permeability is obtained and it takes a longer time for the heat treatment. In addition, in the case of exceeding 600° C., the permeability is significantly lowered by an overheat treatment, to thus fail to obtain a desired permeability. Generally, when the heat treatment temperature is low, it takes a long time for the heat treatment. In contrast, when the heat treatment temperature is high, the heat treatment time is shortened.

In addition, when the ribbon sheet is a nanocrystalline alloy, an amorphous ribbon equal to or less than 30 μm made of a Fe-based amorphous ribbon, e.g., a Fe—Si—B—Cu—Nb alloy is prepared by a rapidly solidification process (RSP) due to melt spinning. Then, the amorphous ribbon sheet is heat treated under no magnetic field environment, at a temperature of 300° C. to 700° C. for 30 minutes to 2 hours thereby obtaining a nanocrystalline alloy having a desired permeability (S13).

In this case, since content of Fe is more than 70 at %, if heat treatment is made in the air in view of the heat treatment atmosphere, oxidation is made to thereby cause an undesirable situation in terms of visual aspects. Thus, the heat treatment is preferably performed in a nitrogen atmosphere. However, even if the heat treatment is made under an oxidizing atmosphere, permeability of the sheet has substantially no difference at the same temperature condition.

In the case that the heat treatment temperature is less than 300° C., the nanocrystalline grains are not sufficiently produced and thus a desired permeability is not obtained. In addition, it takes a longer time for the heat treatment. In addition, in the case of exceeding 700° C., the permeability is significantly lowered by an overheat treatment. Generally, when the heat treatment temperature is low, it takes a long time for the heat treatment. In contrast, when the heat treatment temperature is high, the heat treatment time is shortened.

In addition, the ribbon sheet according to the embodiment of the present invention has a thickness of a range of 15~35 μm, and the magnetic permeability of the ribbon sheet is increased in proportion to the thickness of the ribbon sheet.

Furthermore, after the heat treatment is made, the ribbon sheet becomes brittle, and thus is easily flake-treated when carrying out a flake treatment process in a later step.

Subsequently, as shown in FIGS. 2 and 3, a flake treatment process is performed with respect to one or a multilayer (of desired layers) of the heat treated ribbon sheets 2a; and 21-26, at a state where a protective film 1 is attached on one side thereof, and a double-sided tape 3; and 3f attached with a release film 4 is attached on the other side thereof (S14).

Figure 8:
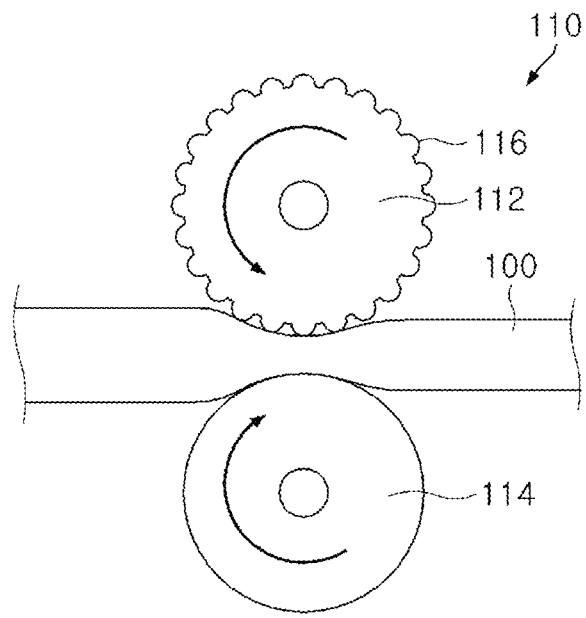
FIGS. 8 and 9 are cross-sectional views showing a flake treatment process of a laminate sheet according to an embodiment of the present invention, respectively.
Figure 9:
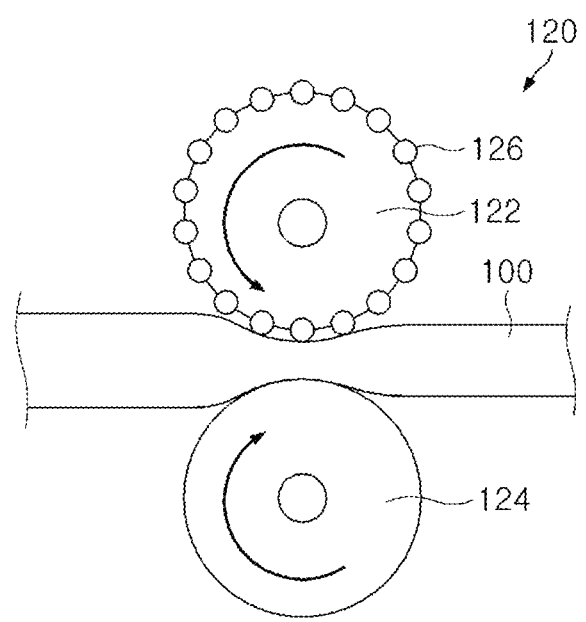

The flake treatment process is executed by allowing the laminate sheet 100 that is obtained by sequentially stacking, for example, the protective film 1, the ribbon sheets 2a; and 21-26, the double-sided tape 3, and the release film 4, to pass through first and second flake devices 110 and 120 illustrated in FIGS. 8 and 9, to thereby separate the ribbon sheets 2a; and 21-26 into a number of fine pieces 20. In this case, a plurality of the separated fine pieces 20 are maintained to keep a separated state by first and second adhesive layers 12 and 31 that are bonded to both sides of the ribbon sheets 2a; and 21-26.

For example, as shown in FIG. 8, an available first flake device 110 may consist of a metal roller 112 on the outer surface of which a plurality of irregularities 116 are formed, and a rubber roller 114 that is disposed in opposition to the metal roller 112. As shown in FIG. 9, a second flake device 120 may be composed of a metal roller 122 on the outer surface of which a plurality of spherical balls 126 are mounted, and a rubber roller 124 that is disposed in opposition to the metal roller 122.

Thus, when the laminate sheet 100 is passed through the first and second flake devices 110 and 120, the ribbon sheet 2a is separated into a number of the fine pieces 20 and gaps 20a are formed between the fine pieces 20, as shown in FIG. 10. FIG. 10 shows that a single ribbon sheet 2a has been flake-treated.

Since the fine pieces 20 of the ribbon sheet 2a are formed to have a size of a range of several tens micrometers (μm) to 3 milimeters (mm), a demagnetizing field is made to increase to thereby remove a hysteresis loss and to thus heighten a uniformity of the permeability of the sheet.

Further, the flake treatment process of the ribbon sheet 2a may reduce the surface area of the fine pieces 20 and prevent a heat generation problem caused by an eddy current that is produced by an alternating-current magnetic field.

The flake treated laminate sheet 200 has the gaps 20a between fine pieces 20. Thus, when the water is penetrated into the gaps 20a, the ribbon sheet is oxidized and the appearance of the ribbon sheet becomes poor and the shield performance is degraded.

Further, in the case that only a flake treatment process is performed, the fine pieces 20 are in contact with each other along the flow of the fine pieces 20, to accordingly increase the size of the fine pieces 20 and to thus cause a problem that the eddy-current loss increases.

Furthermore, the flake treated laminate sheet 200 may have non-uniformity caused on the surface of the sheet during performing the flake treatment process, and stabilization of the flake treated ribbon is needed.

Thus, the flake treated laminate sheet 200 undergoes a laminating process for flattening, slimming, and stabilization of the sheet 200, while simultaneously filling the adhesive into the gaps 20a of the fine pieces 20 (S15). As a result, water penetration is prevented, and at the same time all sides of the fine pieces 20 are surrounded by the adhesive, to thereby separate the fine pieces 20 from one another and reduce the eddy current.

Figure 11:
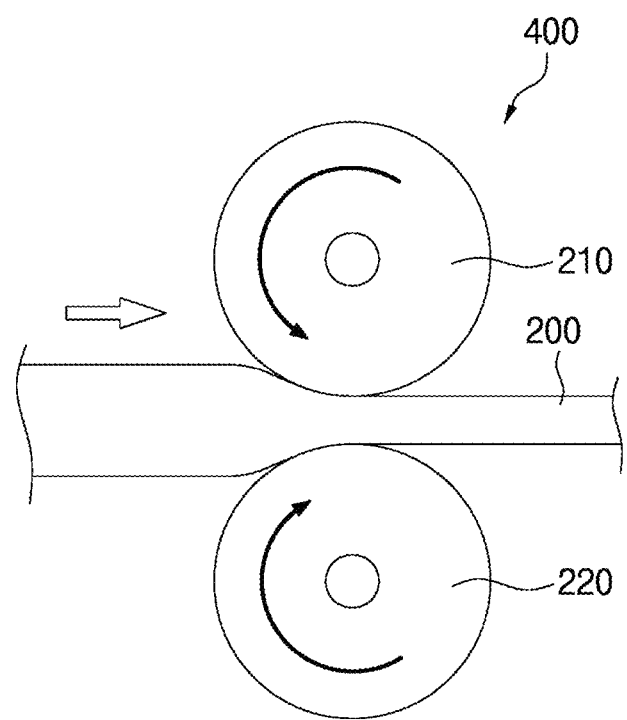
FIGS. 11 and 12 are cross-sectional views showing a laminating process of a flake-treated laminate sheet according to an embodiment of the present invention, respectively.
Figure 12:
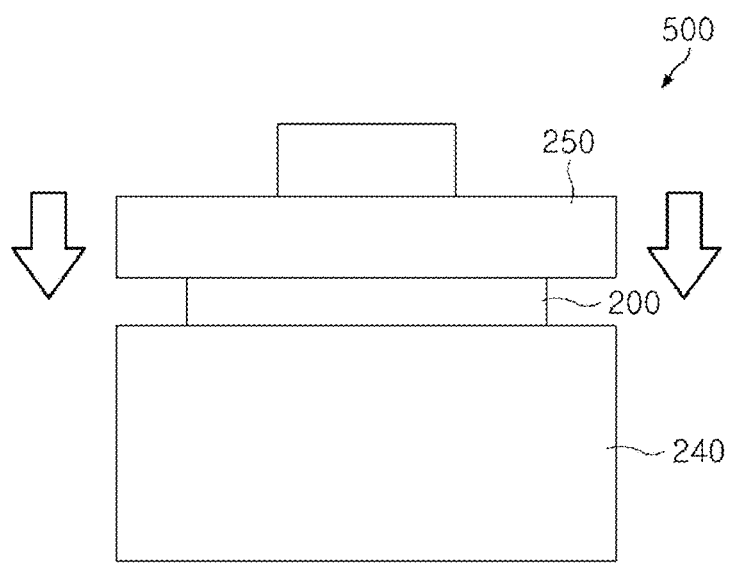

As shown in FIG. 11, a laminating device 400 for the laminating process may employ a roll press type including a first pressing roller 210 and a second pressing roller 220 that is disposed at a predetermined distance from the first pressing roller 210, between which the flake treated laminate sheet 200 passes. As shown in FIG. 12, a laminating device 500 for the laminating process may employ a hydraulic press type including a lower pressing member 240 and an upper pressing member 250 that is vertically movably disposed on the upper side of the lower pressing member 240.

When the flake treated laminate sheet 200 is heated at room temperature or at a temperature of 50° C. to 80° C., and then is passed through the laminating device 400 or 500, a first adhesive layer 12 of the protective film 1 is pressed, while some of the adhesive of the first adhesive layer 12 are introduced into the gaps 20a to seal the gaps 20a. Simultaneously, the double-sided tape 3 is pressed, while some of the adhesive of the second adhesive layer 31 are introduced into the gaps 20a to seal the gaps 20a.

Here, the first adhesive layer 12 and the second adhesive layer 31 may be formed by using an adhesive that can be deformed at the time of being pressed at room temperature, or may be formed by using a thermoplastic adhesive that can be thermally deformed by applied heat.

In addition, the first adhesive layer 12 and the second adhesive layer 31 preferably have a thickness of at least 50% when compared to the thickness of the ribbon so as to sufficiently fill the gaps 20a between the fine pieces 20.

Further, the interval between the first pressure roller 210 and the second pressure roller 220 and the interval between the upper pressing member 250 and the lower pressing member 240 when the upper pressing member 250 is in a lowered state, are preferably formed of a thickness of 50% or less when compared to the thickness of the laminate sheet 200, so that the adhesives of the first adhesive layer 12 and the second adhesive layer 31 can be introduced into the gaps 20a.

In addition, when a multi-layer structure of the ribbon sheet 21-26 shown in FIG. 3 is used as the magnetic sheet 2, some of the adhesive of the first adhesive layer 12 of the protective film 1 and some of the adhesive of the second adhesive layer 31 of the double-sided tape 3, and some of the adhesive of the adhesive layers inserted between the laminated ribbon sheets 21-26 or some of the adhesive of the double-sided tapes 3a-3e are filled into the gaps 20a to thus separate the fine pieces 20.

Any device of performing the pressing and the flake treatment process of the laminate sheets 100 and 200 can be used in some embodiments of the present invention.

As shown in FIG. 13, when the laminating process is completed, an electromagnetic wave shield sheet 10 according to an embodiment of the present invention may have a structure that the first adhesive layer 12 and the second adhesive layer 31 partially fill the gaps 20a between the fine pieces 20 at a state where the thin magnetic sheet 2 using the ribbon sheet 2a is separated into a plurality of the fine pieces 20, to thereby prevent the oxidation and the flow of the ribbon sheet 2a.

Finally, the magnetic field shield sheet 10 having undergone the laminating process is stamped into a size and a shape corresponding to a place and a usage for mounting of an electronic device so as to be produced into products (S16).

In some embodiments of the present invention, when six (6) ribbon sheets 21-26 are laminated as the thin magnetic sheet 2 as shown in FIG. 3, the total thickness of the sheets including the protective film 1 and the release film 4 is 212 μm before the lamination being performed, but after the lamination is made, the thickness thereof becomes slimmed as thin as 200 μm.

In the embodiment, it has been described with respect to the case that a single sheet of the protective film 1 is adhered to one side of the magnetic sheet 2 and then the flake treatment process and the laminating process are executed, but the protective film 1 may be damaged by the flake treatment process. Thus, preferably, a temporary protective film for protecting the protective film 1 is attached on top of the protective film 1 before performing a flake treatment process, and then the temporary protective film on the surface of the magnetic sheet 2 is peeled off and removed after completion of the flake treatment process.

(Humidity Test)

A humidity test was conducted for 120 hours at temperature of 85° C. and humidity of 85% with respect to the magnetic field shield sheet 10 that has undergone the flake treatment process and pass through the lamination process and the laminate sheet 200 that has undergone the flake treatment process but does not pass through the lamination process.

Figure 14A:
FIG. 14A is an enlarged photograph of a magnetic field shield sheet that has not passed through a laminating process after having performed a flake treatment process, but has undergone a humidity test.
Figure 14B:
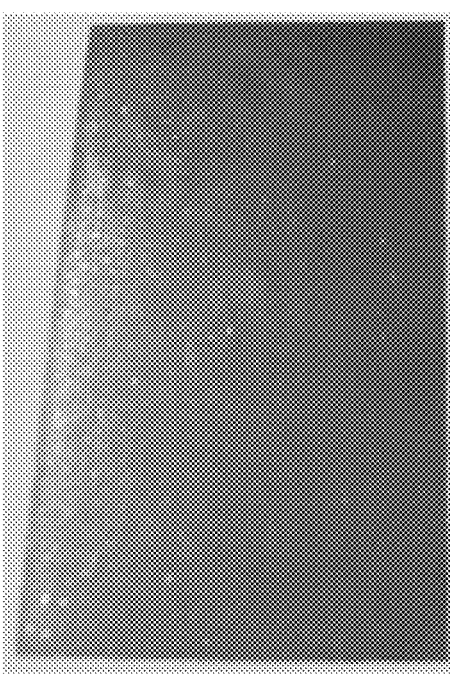
FIG. 14B is an enlarged photograph of a magnetic field shield sheet that has passed through a laminating process after having performed a flake treatment process and has undergone a humidity test, according to an embodiment of the present invention.

As a result, as shown in FIG. 14A, in the case of the laminate sheet 200 where only the flake-treatment was processed, it can be seen that water is penetrated into the gaps between fine pieces when the ribbon has been separated into a large number of fine pieces and then the ribbon is oxidized, and thus the appearance of the ribbon was changed. However, it can be seen that the magnetic field shield sheet 10 in accordance with the embodiment of the present invention showed the appearance that had not changed as shown in FIG. 14B.

Figure 15A:
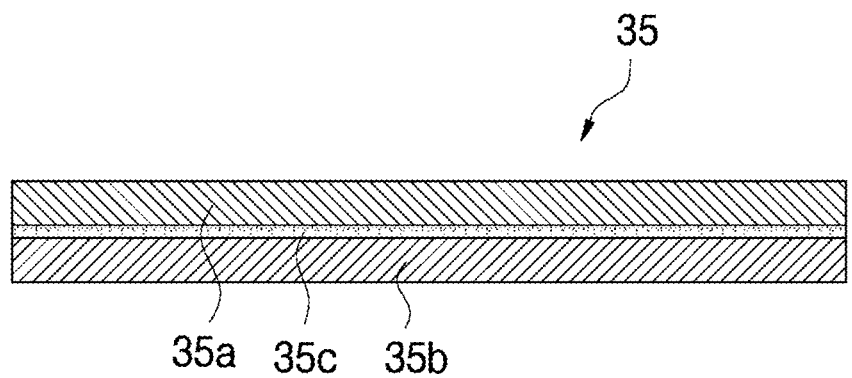
FIGS. 15A and 15B are a cross-sectional view and a plan view showing a thin-film magnetic sheet that is used a magnetic field shield sheet for NFC and wireless charging according to a fourth embodiment of the present invention.
Figure 15B:
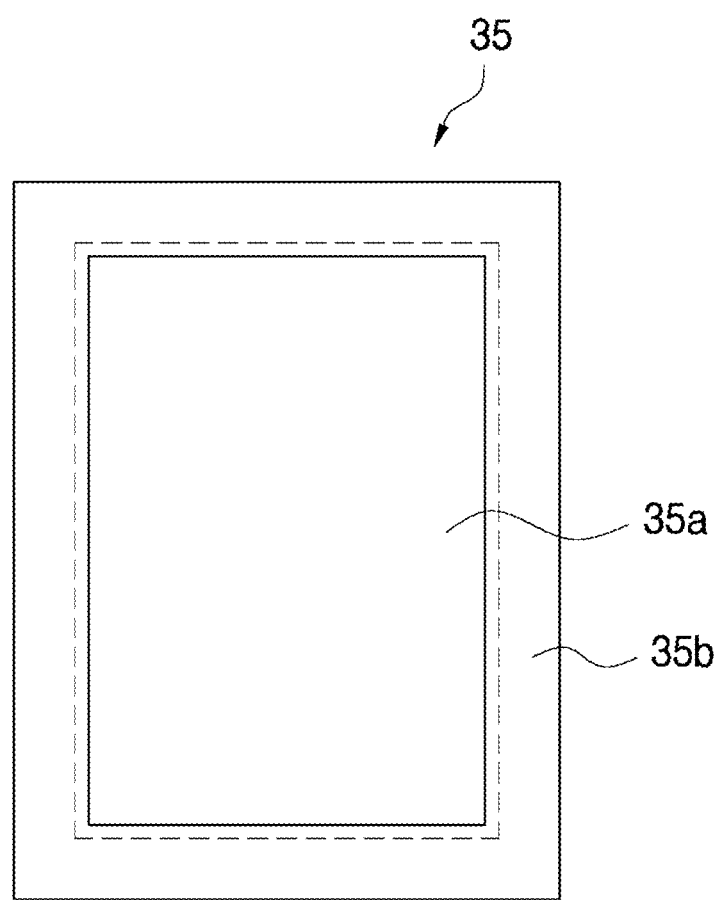

Meanwhile, the magnetic field shield sheet according to the embodiment of the present invention may be configured by using different materials as illustrated in FIGS. 15A and 15B.

As shown in FIG. 15A, a hybrid type magnetic field shield sheet 35 can be configured to include a first magnetic sheet 35a of a high permeability and a second magnetic sheet 35b of a permeability lower than that of the first magnetic sheet 35a in a hybrid form, in which an adhesive layer 35c is inserted and combined between the first magnetic sheet 35a and the second magnetic sheet 35b. The adhesive layer 35c can be configured of an adhesive layer of a non-base type or a double-sided tape of a base type.

As in the first and second embodiments shown in FIGS. 1 to 3, the first magnetic sheet 35a can employ the shield sheet 10 or 10b that is obtained by flake-treating an ribbon sheet made of an amorphous alloy or a nanocrystalline alloy to then be used as the thin magnetic sheet 2.

The second magnetic sheet 35b may be formed of a polymer sheet consisting of a magnetic powder of a high permeability such as an amorphous alloy powder, soft magnetic powder, or a Sendust, and a resin.

In this case, the amorphous alloy powder has a composition selected from the group consisting of, for example, Fe—Si—B, Fe—Si—B—Cu—Nb, Fe—Zr—B and Co—Fe—Si—B, and preferably is formed of an amorphous alloy powder comprising one or more amorphous alloys.

Further, in the case that both a near field communications (NFC) function and a wireless charging function are employed in a mobile terminal device, the hybrid-type magnetic field shield sheet 35 includes the first and second magnetic sheets 35a and 35b bonded by the adhesive layer 35c. In this case, the first magnetic sheet 35a employs the magnetic field shield sheet 10 or 10b of the first or second embodiment that is configured by using an ribbon sheet, and the second magnetic sheet 35b employs a ferrite sheet having a low frequency dependence, in which the first magnetic sheet 35a and the second magnetic sheet 35b are laminated to thus make the magnetic field shield sheet 35 for NFC and wireless charging. Therefore, optimally, the second magnetic sheet 35b employing a ferrite sheet is used for shielding the magnetic field for NFC, and the first magnetic sheet 35a employing an amorphous ribbon sheet is used for wireless charging.

In this case, the ferrite sheet that is used as the second magnetic sheet 35b is made of a split ferrite in which a ferrite is divided into a number of divided pieces, and the upper and lower portions and side surfaces of each split ferrite are preferably surrounded by an insulator such as an adhesive layer.

Furthermore, when a mobile terminal device employs both the NFC and wireless charging functions, the hybrid type magnetic field shield sheet 35 may be formed by using a shield sheet 10 or 10b using a certain area of a ribbon sheet at a center of the hybrid-type thin film magnetic sheet 35, as a first magnetic sheet 35a, and by combining a second annular magnetic sheet 35b that surrounds the whole of the first magnetic sheet 35a on the outside of the first magnetic sheet 35a into a ferrite sheet, as shown in FIG. 15B. That is, the second magnetic sheet 35b (that is, the ferrite sheet) having a relatively smaller permeability than the first magnetic sheet 35a (that is, the ribbon sheet) is formed in a loop form and is arranged in the outer block of the first magnetic sheet 35a (that is, the ribbon sheet).

Figure 16:
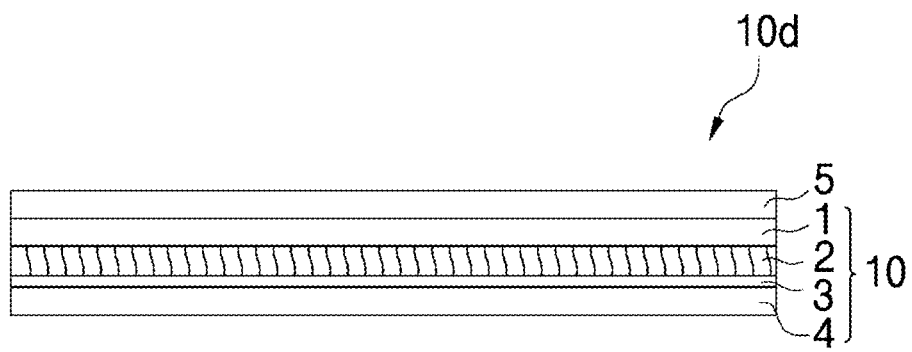
FIG. 16 is a cross-sectional view showing a composite sheet for shielding a magnetic field and an electromagnetic wave according to a fifth embodiment of the present invention.

Meanwhile, FIG. 16 shows a composite sheet for shielding a magnetic field and an electromagnetic wave according to a fourth embodiment of the present invention.

The shield sheet 10d for shielding a magnetic field and an electromagnetic wave according to the fourth embodiment of the present invention has a structure that a conductive sheet 5 made of a Cu or Al foil having excellent electrical and thermal conductivities is bonded on an upper surface of the protective film 1 or a lower surface of a double-sided tape 3 of the magnetic field shield sheet 10 according to the first embodiment of the present invention, by using a double-sided tape or adhesive, so as to provide a function of shielding the electromagnetic wave and a heat radiation function. FIG. 16 shows that the conductive sheet 5 is formed on an upper portion of the protective film 1 of the magnetic field shield sheet 10.

The adhesive preferably employs an acrylic-based adhesive having a thermal conductivity function. The acrylic-based adhesive is a room temperature curable adhesive.

The adhesive may contain Ag and Ni powders of 10~30 volume % for the total adhesive volume %. The Ag and Ni powders may improve a heat radiation effect as conductive metal powders by providing the thermal conduction function for the adhesive layer.

When the sum content of the Ag and Ni powders is less than 10 volume %, it is hard to achieve a thermal conductivity function, and when it is more than 30 volume %, the adhesion of the adhesive deteriorates.

In addition, the adhesive further comprises a binder, an additive, a curing agent to improve the adhesion. The binder may be epoxy-based, the additive may comprise a diluent and/or a dispersing agent.

It is suitable that the conductive sheet 5 attached on the magnetic field shield sheet 10 has a thickness of 5 to 100 μm, preferably, a thickness of 10 to 20 μm. The thickness of a copper heat radiation layer is 10 μm or less.

A composite sheet 10d for shielding the magnetic field and the electromagnetic wave according to a fourth embodiment is preferably configured by including: bonding a conductor sheet 5 on a double-side tape 3; temporarily welding an NFC antenna 6 or a dual antenna 40 for NFC and wireless charging on an opposite surface on which the conductor sheet 5 is not attached, that is, an upper portion of the protective film 1 in the medium of a double-sided tape (or a bonding sheet); and further performing an additional processing such as a hot press process after attaching cover lays on both sides of the antenna 6 or 40.

Further, a thin film metal layer made of one selected from Cu, Ni, Ag, Al, Au, Sn, Zn, Mn or a combination thereof, can be formed on an upper surface of the protective film 1 or a lower surface of the double-sided tape 3 by any one of a sputtering method, a vacuum evaporation method, a chemical vapor evaporation method, and an electroplating method, other than the conductive sheet 5 made in the form of a foil.

In the case that the metal layer is made of Cu, the process may further include depositing a seed layer made of Ti—Cu by a sputtering method to enhance a bonding strength of the Cu metal layer. The thickness of the Cu metal layer may be set to 10 μm or above, and the thickness of the seed layer made of Ti—Cu may be set to 0.5 μm.

The composite sheet 10d having the magnetic field shielding function, the electromagnetic wave shielding function, and the heat radiation function, prevents an increase of a frequency variation width when the NFC antenna is mounted in a battery pack in the case that, for example, an electromagnetic wave such as the power supply noise is severely generated, to thus reduce a failure rate of the NFC antenna, and has a heat radiation function through the heat dissipation at the time of heat generation of a main body or a battery in the mobile terminal device.

In this case, the composite sheet 10d according to the fourth embodiment is attached on a back surface of a battery chamber cover via the double-sided tape so that the conductive sheet 5 is exposed toward the battery.

Meanwhile, the magnetic field shield sheets 10-10c according to the first to third embodiments of the present invention are configured by laminating a single or a plurality of ribbon sheets 21-26 as the magnetic sheet 2 to thus flake-treating the single or the plurality of ribbon sheets 21-26, the gaps 20a formed between the fine pieces 20 are maintained under the control of a pressing force during the laminating process, as shown in FIG. 10, to thus achieve an air trap structure capable of trapping the air.

That is, protective film 1 and the double-sided tape 3 are attached to both surfaces of the thin magnetic sheet 2 and the adhesive layers or the double-sided tapes 3a-3e are inserted between a plurality of the laminated ribbon sheets 21-26. Thus, the gaps 20a formed between the fine pieces 20 have closed fine pores capable of trapping the air.

The air trapped in the closed fine pores does not leave itself out, that is, suppresses the convection, to thus play a role of trapping heat transferred from a heat source and inhibiting a heat transfer. In this case, the air trapped in the fine pores is known to have a low thermal conductivity of 0.025 W/mK, and thus the magnetic field shield sheets 10-10b can act as insulating sheets having an excellent heat insulating function with respect to the Z-direction perpendicular to the plane of the sheet.

In addition, the composite sheet 10d for shielding the magnetic field and the electromagnetic wave according to the fourth embodiment may serve as a heat spread sheet in which the conductive sheet 5 made of a Cu or Al foil having an excellent thermal conductivity rapidly diffuses the transferred heat in the XY direction.

In general, in the case that a heating element such as an integrated circuit (IC) for a plurality of signal processing devices is provided in a closed space within a mobile terminal device, the heat of the heating element is spread by the heat spread sheet as quickly as possible, to thereby prevent the local temperature rise, and the heat is blocked or delayed by the heat insulating sheet from being delivered to a user through a display of a front surface or a cover of a back surface.

For example, the receiving device for wireless charging includes a DC-DC converter that rectifies a high-frequency wireless power signal received from a secondary coil, i.e. an antenna coil 43 for wireless charging into a DC signal, to then convert the DC signal into a voltage level needed to be stored in a battery, or a processor for signal processing used in the control for increasing a reception efficiency of the wireless power signal.

Therefore, when the composite sheet 10d for shielding the magnetic field and the electromagnetic wave according to the fourth embodiment, is used as, for example, a magnetic field shield sheet for wireless charging, and is extended, and active elements such as the above-described processor for signal processing are mounted on the extended portion, the conductive sheet 5 diffuses the heat generated from the active elements in the horizontal direction and the magnetic field shield sheet 10 blocks or delays the heat transfer in the Z-direction, that is, insulates the heat transfer to thus reduce the heat that is delivered to a user grasping a mobile terminal device through a rear cover of the mobile terminal device.

The composite sheet according to the embodiment has a conductive layer having an electromagnetic wave shielding function and the heat radiation and a large number of fine pores provided in the shield sheet acting as a thermal barrier layer that can trap the heat, to thereby perform functions of shielding the magnetic field and the electromagnetic wave, the heat radiation function and the heat insulation function.

Meanwhile, an NFC antenna module that is obtained by applying the magnetic field shield sheet in accordance with the embodiment of the present invention described above to an NFC antenna and a structure of the magnetic field shield sheet attached to the mobile terminal device will be described below with reference to FIGS. 17 and 18.

FIG. 17 is an exploded perspective view showing a relationship between a magnetic field shield sheet and an NFC antenna according to an embodiment of the present invention. FIG. 18 is an exploded perspective view showing that the NFC antenna module of FIG. 17 is assembled with a battery chamber cover to then be coupled to a mobile terminal device.

Referring to FIG. 17, when the magnetic field shield sheet according to the embodiment of the present invention is applied to an NFC antenna, the NFC antenna 6 is attached on an upper portion of the protective film 1 in the magnetic field shield sheet 10 by using a double-sided tape 30b, and the release film 4 is removed from the lower portion of the magnetic field shield sheet 10 to then attach a finish material to a third adhesive layer 33 of the exposed double-sided tape 3.

Further, it is also possible to remove the release film 4 of the magnetic field shield sheet 10 and attach the NFC antenna 6 to the double-sided tape 3 in place of the antenna assembly method.

The NFC antenna 6 and the magnetic shield sheet 10 are assembled to form an NFC antenna module 103. The NFC antenna module 103 is attached to a battery chamber cover 15 of a mobile terminal device 101 by using a double-sided tape 30a attached on the surface of the NFC antenna 6 as shown in FIG. 18. After that, when the battery chamber cover 15 is coupled to the mobile terminal device 101, the magnetic field shield sheet 10 is used in the form of covering a battery 7.

The assembly position of the magnetic field shield sheet 10 is of course possible to be arranged in known different ways in addition to being placed in the outside of the battery.

When the portable terminal device 101 is used by assembling the back cover to the main body in place of the battery chamber cover, the NFC antenna module 103 may be disposed inside the back cover.

In addition, the NFC antenna module 103 may be configured so that the NFC antenna 6 can be assembled with the magnetic field shield sheet 10a-10d according to the second to fourth embodiments, in addition to the magnetic field shield sheet 10 according to the first embodiment.

Referring to FIG. 17, the NFC antenna 6 can be also used with a well-known structure. The NFC antenna 6 may also be formed of an NFC antenna coil 6a made of any shape of a spiral, rectangle, circle, and oval on a flexible printed circuit board (FPCB) 6b made of a synthetic resin such as, for example, polyimide (PI). The NFC antenna coil 6a is formed by patterning a conductor such as a copper foil attached on the FPCB 6b in a loop form so that an induction current flows by a change in an external magnetic field, or forming a loop-shaped metal pattern on the FPCB 6b by using a conductive ink.

The NFC antenna 6 is formed so that a pair of terminal blocks 6c and 6d are respectively disposed on the projections extended from the FPCB 6b formed at one side of the NFC antenna coil 6a.

The outer line of the NFC antenna coil 6a is connected directly to the first terminal block 6c, and the inner line thereof is connected to a second terminal block 6d through terminal connection patterns (not shown) that are formed on the back surface of the FPCB 6b via conductive through-holes 6e and 6f.

Also, the NFC antenna 6 is attached to the magnetic field shield sheet 10 by using the double-sided tape 30b. In place of the NFC antenna 6 and the double-sided tape 30b, an NFC antenna coil 6a is directly formed on an adhesive sheet acting as an insulating layer, for example, on a double-sided tape, by using an image transfer method, to thus be fabricated in a thin film structure. As a result, the FPCB 6b on which the NFC antenna coil 6a is formed may be removed to thus achieve thinning.

In the case that the NFC antenna module 103 that is formed by the assembly of the NFC antenna 6 and the magnetic field shield sheet 10 is provided in the battery chamber cover 15 of the mobile terminal device 101 as described above, the influences upon the mobile terminal devices 101 by an alternating-current (AC) magnetic field generated when an NFC function is implemented in the mobile terminal device 101 in a non-contact (wireless) method may be blocked and electromagnetic waves that are required to perform the NFC function may be absorbed.

That is, the magnetic field shield sheet 10 according to the embodiment of the present invention includes a multi-layer magnetic sheet 2 in which one or more ribbon sheets are flake-treated and separated into a large number of fine pieces 20, to thus increase a Q value to thus increase high-frequency signal transmission and power transmission efficiency, and simultaneously the surface area of the sheet is reduced by the flake treatment process, to thereby block a heat generation problem of a battery (or a secondary battery) 7 due to the eddy current caused by the AC magnetic field.

Meanwhile, FIG. 19 is a plan view showing a dual antenna structure in which an NFC antenna and an antenna for wireless charging according to an embodiment of the present invention are integrally formed on a single FPCB Flexible Printed Circuit Board).

A dual antenna 40 for performing both NFC and wireless charging functions is preferably implemented by using an FPCB having a double-sided substrate structure. However, the dual antenna according to an embodiment of the present invention may have a different type of a structure which is not limited thereto.

Referring to FIG. 19, the dual antenna 40 includes, for example, an NFC antenna coil 41 and a wireless charging secondary coil 43 that are formed together on a substrate 49 using the FPCB. In this case, the substrate 49 may employ, for example, a double-sided adhesive tape, and the NFC antenna coil 41 and the wireless charging secondary coil 43 may be formed on the bonded substrate using an image transfer method.

The NFC antenna coil 41 has a frequency band higher than the secondary coil 43 for wireless charging, and thus is formed of a conductive pattern of a rectangular shape having a fine line width along the outer edge of the substrate 49. The wireless charging secondary coil 43 is required to perform the power transfer and has a frequency band lower than the NFC antenna coil 41, and thus is formed of a conductive pattern of a substantially elliptical shape having a line width wider than the NFC antenna coil 41 inside the NFC antenna coil 41. The NFC antenna coil 41 and the wireless charging secondary coil 43 are formed by a method of patterning by etching a copper foil attached to the substrate 49. The NFC antenna coil 41 and the wireless charging secondary coil 43 have inductance values set to serve as an NFC antenna and an antenna for wireless charging.

In this case, the secondary coil 43 for wireless charging receives a power wirelessly, and thus can employ a normal coil that is wound in a planar inductor form to then be adhered on the substrate.

The dual antenna 40 is formed so that a pair of terminal blocks 41a and 41b; and 43a and 43b are respectively disposed on the projections extended from the substrate 49 formed at one side of each of the NFC antenna coil 41 and the wireless charging secondary coil 43.

The outer line of the NFC antenna coil 41 is connected directly to the first terminal block 41a, and the inner line thereof is connected to a second terminal block 41b through terminal connection patterns (not shown) that are formed on the back surface of the substrate 49 via conductive throughholes 45a and 45b.

Similarly, the outer line of the secondary coil 43 for wireless charging is connected to a third terminal block 43a through terminal connection patterns (not shown) that are formed on the back surface of the substrate 49 via conductive throughholes 47a and 47b, and the inner line thereof is connected to a fourth terminal block 43b through terminal connection patterns (not shown) that are formed on the back surface of the substrate 49 via conductive throughholes 47c and 47d.

A protective film for protecting an antenna coil pattern such as, for example, a Photo Solder Resist (PSR) is preferably formed on the surface of the substrate 49.

When employing both the NFC and wireless charging functions, as described above, the shield sheet employing the hybrid type magnetic sheet of FIGS. 15A and 15B may be used.

Meanwhile, the mobile terminal device 101 includes a rectifier (not shown) for rectifying an AC voltage generated in the secondary coil 43 for wireless charging into a direct-current (DC) voltage, and the DC voltage is charged to a battery (or a secondary battery) 7.

In the case that the dual antenna 40 illustrated in FIG. 19 is coupled to one of the magnetic field shield sheets 10-10d is applied to a mobile terminal device 101, both the NFC antenna coil 41 and the wireless charging secondary coil 43 are provided so that the NFC and wireless charging can be solved together, and the influences upon the mobile terminal devices 101 by an alternating-current (AC) magnetic field generated when an NFC function and a wireless charging function are implemented in the mobile terminal device 101 in a non-contact (wireless) method may be blocked and electromagnetic waves that are required to perform the NFC function may be absorbed.

Meanwhile, the above embodiment has been described with respect to the structure that both the NFC antenna coil 41 and the secondary coil 43 for wireless charging constituting the dual antenna are disposed on one surface of the substrate, but it may be configured such that the NFC antenna coil 41 is disposed on one surface of the substrate and the secondary coil 43 for wireless charging is disposed on the other surface of the substrate.

FIGS. 20A and 20B are a plan view and an equivalent circuit diagram respectively showing a structure of implementing an integral antenna for NFC and wireless charging by using a single coil in a single FPCB according to an embodiment of the present invention.

As shown in FIG. 20A, the integral antenna 50 for NFC and wireless charging includes a single spiral coil portion 51 along the edges of a rectangular substrate 59 on the rectangular substrate 59 in which three terminal blocks are connected to the single spiral coil portion 51.

The coil portion 51 may be formed by, for example, patterning a copper foil formed in the FPCB substrate, the outer line of the coil portion 51 is directly connected to the first terminal block 53, and the inner line thereof is connected to a second terminal block 55 via conductive throughholes and terminal connection patterns (not shown) that are formed on the back surface of the substrate 59. A lead wire that is branched and drawn out from the coil portion 51 at a predetermined position between the first and second terminal blocks 53 and 55 is connected to a third terminal block 54 via conductive throughholes and terminal connection patterns (not shown) that are formed on the back surface of the substrate 59.

As shown in the equivalent circuit diagram shown in FIG. 20B, the antenna for NFC and wireless charging is configured so that, since the entire coil portion 51 located between the first terminal block 53 and the second terminal block 55 has a large inductance value, the inductance value is set to act as an antenna for wireless charging through which relatively low radio frequency power communications are executed, and since a first coil portion 51a located between the first terminal block 53 and the third terminal block 54 or a second coil portion 51b located between the second terminal block 55 and the third terminal block 54 has a small inductance value, the inductance value is set to act as an antenna for NFC through which relatively high radio frequency power communications are executed.

In other words, the total length of the coil portion 51 is set to have an inductance value of the antenna for wireless charging, and the branch position of the third terminal block 54 is set so that inductance value of the first coil portion 51a or the second coil portion 51b acts as an antenna for NFC.

As a result, the NFC and wireless charging function combined antenna receives a wireless charging signal in accordance with the wireless power communications from the first terminal block 53 and the second terminal block 55, and receives a wireless signal for NFC from the first terminal block 53 and the third terminal block 54, or the second terminal block 55 and the third terminal block 54, to thus achieve the NFC communication.

Hereinafter, the present invention will be described in more detail with reference to the following embodiments. However, the following embodiments are nothing but the illustration of the invention, and the scope of the invention is not limited thereto.

Embodiments 1-4, Comparative Embodiments 1-3

Electrical Characteristics of the Magnetic Field Shield Sheets

The case that no magnetic field shield sheet is not used (Comparative Embodiment 1), a magnetic field shield sheet using a single amorphous ribbon sheet that is not heat-treated (Comparative Embodiment 2), a magnetic field shield sheet using a single heat-treated nanocrystalline ribbon sheet (Comparative Embodiment 3), a flake treated magnetic field shield sheet using a single heat-treated nanocrystalline ribbon sheet (Embodiment 1), a flake treated magnetic field shield sheet using two heat-treated nanocrystalline ribbon sheets (Embodiment 2), a flake treated magnetic field shield sheet using three heat-treated nanocrystalline ribbon sheets (Embodiment 3), and a flake treated magnetic field shield sheet using four heat-treated nanocrystalline ribbon sheets (Embodiment 4) were prepared.

An amorphous ribbon applied to the shield sheet was made of a $Fe_{73.5}Cu_1Nb_3Si_{13.5}B_9$ alloy, prepared into a thickness of 25 μm in a rapidly solidification process (RSP) by a melt spinning method, cut in a sheet form, and heat treated at 580° C. in $N_2$ atmosphere, under no magnetic field for one hour, to thereby obtain an amorphous ribbon sheet. Then, the obtained ribbon sheet was inserted between a protective film of 10 μm thick using a PET (Polyethylene Terephthalate) substrate and a double-sided tape (a release film excluded) of 10 μm thick using a PET substrate to prepare a laminate sheet, and then a flake treatment process and a laminating process were executed by using a flake treatment process unit of FIG. 8 and a lamination unit of FIG. 11. When two or more nanocrystalline ribbon sheets were laminated, the double-sided tapes interposed between the sheets were obtained by forming acrylic adhesive layers on both surfaces of the PET film, and the double-sided tapes each having a thickness of 12 μm were employed.

In order to examine the effects influenced upon a secondary coil when a prepared shield sheet was used in a wireless charger, a circular planar coil having the inductance of 12.2 μH and the resistance of 237 mΩ was used as the secondary coil coupled to the shield sheet, that is, as a measuring coil. After having connected the measuring coil to an LCR meter (which is a piece of electronic test equipment used to measure the inductance (L), capacitance (C), and resistance (R) of a component), the measuring coil was located on the shield sheet and a cuboid of about 500 g was placed on the measuring coil, so as to be applied at a constant pressure state, and setting values of the LCR meter were set to 100 kHz and 1 V, to thereby measure the inductance (Ls), the magnetic resistance (Rs), the impedance (Z), and the quality factor (Q) as shown in Table 1 below.

TABLE 1

| The ribbon used | The number of ribbons | Ls (μH) | Rs (mΩ) | Z (Ω) | Q |
|---|---|---|---|---|---|
| Comparative Embodiment 1 (no sheet) | 0 | 12.08 | 245 | 7.59 | 30.9 |
| Comparative Embodiment 2 (non-heat-treated ribbon) | 1 EA | 17.91 | 1020 | 11.3 | 11.03 |
| Comparative Embodiment 3 (heat-treated ribbon) | 1 EA | 21.74 | 605 | 13.67 | 22.53 |
| Embodiment 1 (heat treated and flake treated) | 1 EA | 21.52 | 442 | 13.52 | 30.5 |
| Embodiment 2 (heat treated and flake treated) | 2 EA | 21.54 | 355 | 13.54 | 38 |
| Embodiment 3 (heat treated and flake treated) | 3 EA | 21.56 | 327 | 13.55 | 41.4 |
| Embodiment 4 (heat treated and flake treated) | 4 EA | 21.7 | 308 | 13.64 | 44.2 |

As can be seen from Table 1, in the case of a shield sheet (Comparative Embodiment 2) using a ribbon that was not heat-treated, it showed that since the magnetic permeability was low, the inductance (Ls) of the secondary coil was small, and since the electric resistance of the ribbon was low, the magnetic resistance (Rs) was large and thus the quality factor (Q) of the coil was significantly low.

In the case of a shield sheet (Comparative Embodiment 3) that was heat-treated, it showed that since the magnetic permeability was high, the inductance (Ls) of the secondary coil was large, and since the electric resistance of the ribbon sheet is large through a nanocrystalline microstructure formed in the ribbon sheet by the heat treatment, the magnetic resistance (Rs) was significantly lowered when compared to that before the heat treatment, and thus the quality factor (Q) of the coil was significantly high when compared to that before the heat treatment.

In addition, in the case of a shield sheet (Embodiment 1) that was obtained by using a heat-treated ribbon sheet and flake-treating the ribbon sheet, it can be seen that the inductance (Ls) of the secondary coil was not significantly changed, the magnetic resistance (Rs) was significantly lowered when compared to the case that the flake-treatment was not processed, and thus quality factor (Q) of the entire coil was significantly elevated.

Further, as compared with Embodiment 1, it showed that as the number of stacked layers of ribbon sheets may increase, the quality factor (Q) of the coil value may significantly increase.

As described above, when the shield sheet according to an embodiment of the present invention is used for a wireless charger, the inductance (Ls) and the quality factor (Q) of the secondary coil are high, and the magnetic resistance (Rs) decreases, to thus increase the transmission efficiency of the magnetic flux transmitted from the transmitter with respect to the secondary coil of the wireless charger.

Embodiments 5-8 and Comparative Embodiment 1

Power Transmission Efficiency of the Magnetic Field Shield Sheet

Magnetic field shield sheets according to Embodiments 5 to 7 were prepared in a rectangular shape in the same manner as those in Embodiments 1 to 4, but the number of nanocrystalline ribbon sheets stacked on the sheet only was changed into six (6) sheets, nine (9) sheets, and twelve (12) sheets. A magnetic field shield sheet according to Embodiment 8 differed from a magnetic field shield sheet according to Embodiment 6, in that the shape of the magnetic field shield sheet (the number of nanocrystalline ribbon sheets was six (6)) according to Embodiment 6 was machined in the same annular shape as the shape of the secondary coil.

Figure 18:
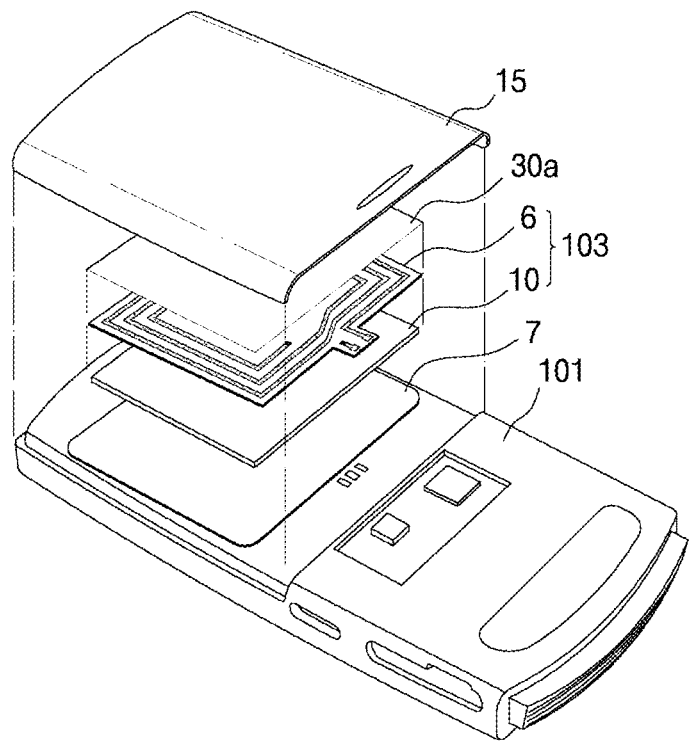
FIG. 18 is an exploded perspective view showing that the NFC antenna module of FIG. 17 is assembled with a battery chamber cover to then be coupled to a mobile terminal.

For the case that no magnetic field shield sheet was not used (Comparative Embodiment 1) and for the magnetic field shield sheets according to Embodiments 5 to 8, as shown in FIG. 18, a voltage (V) and a current (mA) applied to the primary coil of the transmitter (Tx) 8 and a voltage (V) and a current (mA) applied to the secondary coil 6 of the receiver (Rx) were measured in a state where a separator sheet of 0.5 mm thick was placed on an upper portion of the transmitter (Tx) of the wireless charger, and a receiver that was assembled with the magnetic field shield sheet 10 and the secondary coil 6 was placed on a lithium ion battery 7, and the measured results were shown in Table 2, to thus calculate the power transmission efficiency based on Table 2.

TABLE 2

| The ribbon used | Tx V | Tx mA | Rx V | Rx mA | Efficiency (%) |
|---|---|---|---|---|---|
| Comparative Embodiment 1 (no sheet) | 19 | 188 | 4.87 | 520 | 70.895857 |
| Embodiment 5 (6 sheets of rectangular ribbons) | 19 | 205 | 4.87 | 521 | 65.141720 |
| Embodiment 6 (9 sheets of rectangular ribbons) | 19 | 194 | 4.87 | 521 | 68.835323 |
| Embodiment 7 (12 sheets of rectangular ribbons) | 19 | 190 | 4.87 | 521 | 70.284488 |
| Embodiment 8 (6 sheets of coil-shaped ribbons) | 19 | 192 | 4.87 | 521 | 69.552357 |

In the case that which the permanent magnet is contained in the transmitter of the wireless charger according to the prior art, the thickness of the shield sheet using the ferrite sheet should be at least 0.5 T due to the DC magnetic field by the permanent magnet, so as to be capable of performing an optimal wireless charging operation as the shield sheet.

Referring to Table 2, as illustrated in Embodiments 5 to 7, when the shape of the shield sheet, that is, the nanocrystalline ribbon sheet was formed in a rectangular shape, it can be seen that twelve (12) nanocrystalline ribbon sheets were laminated in order to have substantially the same power transmission efficiency as that of the receiver of Comparative Embodiment 1 in which no shield sheet was not used.

In addition, in the case of using twelve (12) nanocrystalline ribbon sheets in the same manner as in Embodiment 7 of the present invention, since the high magnetic permeability was high, it showed the same properties as those of the ferrite or polymer sheet even the thickness of 0.3 T less than 0.5 T of the shield sheet using a conventional ferrite sheet.

Further, when the shape of the magnetic field shield sheet (the number of nanocrystalline ribbon sheets was six (6)) according to Embodiment 8 was machined in the same annular shape as the shape of the secondary coil, it can be seen that the power transmission efficiency indicated almost the same as in Embodiment 7, even though the number of the used nanocrystalline ribbon sheets according to Embodiment 8 was half (½) the case of Embodiment 7 (the number of nanocrystalline ribbon sheets was twelve (12)).

As a result, when the shape of the magnetic field shield sheet according to Embodiment 8 was machined in the same annular shape as the shape of the secondary coil, the number of the used nanocrystalline ribbon sheets could be reduced into the half, thereby lowering the manufacturing cost, and further slimming the thickness of the product.

Even if the shape of the secondary coil of the receiver and correspondingly the shape of the magnetic field shield sheet were changed into other shapes, these results showed substantially the same results.

Temperature Characteristics

The magnetic field shield sheet according to Embodiment 8 was set as shown in FIG. 19, and the temperatures of the battery and the nanocrystalline ribbon sheet of the magnetic field shield sheet were measured in units of 30 minutes in the charging time from 30 minutes to 4 hours and 30 minutes, and thus the results were shown in Table 3.

TABLE 3

| Charging operating time | Battery temperature (° C.) | Ribbon sheet temperature (° C.) |
|---|---|---|
| 0.5 hours | 29.5 | 30 |
| 1.0 hours | 30 | 30 |
| 1.5 hours | 30.5 | 30.5 |
| 2.0 hours | 30.5 | 30.5 |
| 2.5 hours | 30.5 | 31 |
| 3.0 hours | 30.5 | 31 |
| 3.5 hours | 30.5 | 31 |
| 4.0 hours | 30.5 | 31 |
| 4.5 hours | 30.5 | 31 |

In general, when a secondary battery such as a lithium-ion battery 7 exceeds over 40° C. during the wireless charging, a problem may be caused with the safety.

When a shield sheet according to the embodiment of the present invention is applied to a wireless charger, as described in Table 3, the temperatures of the battery and the shield sheet were not raised even if the time elapsed, and maintained at 30° C. or so, and thus it can be seen that the safety can be guaranteed.

Embodiment 9

An amorphous ribbon made of a $Fe_{67}B_{14}Si_1Co_{18}$ alloy, was prepared into a thickness of 25 μm in a rapidly solidification process (RSP) by a melt spinning method, cut in a sheet form, and heat treated at 487° C., 459° C., and 450° C., under no magnetic field for one hour. Then, the obtained ribbon sheet was inserted between a protective film of 10 μm thick using a PET (Polyethylene Terephthalate) substrate and a double-sided tape (a release film excluded) of 10 μm thick using a PET substrate to prepare a laminate sheet, and then a flake treatment process and a laminating process were executed by using a flake treatment process unit of FIG. 8 and a lamination unit of FIG. 11.

Here, the number of the ribbon sheets used in the laminated sheet, that is, one to nine ribbon sheets were used by respective heat treatment temperatures, and the double-sided tape was inserted between the ribbon sheets. Then, the inductance (or permeability) and the charging efficiency of the respective amorphous ribbon sheets were measured by respective heat treatment temperatures, and thus the results were shown in Table 4.

TABLE 4

| Inductance (permeability) | Charging efficiency (%) | | | | | | | | |
|---|---|---|---|---|---|---|---|---|---|
| | 1 sheet | 2 sheets | 3 sheets | 4 sheets | 5 sheets | 6 sheets | 7 sheets | 8 sheets | 9 sheets |
| 13 μH at 487° C. | 56 | 61 | 65.6 | 65.8 | 67.1 | 68.4 | 68.9 | 69.1 | inactive |
| 15 μH at 459° C. | 59.2 | 65.8 | 68 | 68.4 | 68.6 | 69.1 | 69.1 | 69.3 | 68.9 |
| 18 μH at 450° C. | 57 | 63.6 | 66.3 | 68 | 68.2 | 68.9 | 69.1 | 69.1 | 68.9 |

When the ribbon sheets was heat-treated at 487° C., 459° C., and 450° C., under no magnetic field for one hour, the inductance (magnetic permeability) of each sheet were measured as 13 μH, 15 μH, and 18 μH, to thereby obtain results that the inductance (magnetic permeability) of each sheet decreased with the increase of the heat treatment temperature.

In the case of the charging efficiency of each sheet by the inductance, the inductance of the heat-treated ribbon sheet at 459° C. was 15 μH at the highest value. As the number of ribbon sheets that were laminated increased from one sheet to eight sheets, the charging efficiency also intended to increase in proportion to the number of amorphous ribbon sheets. When about four sheets were laminated, the charging efficiency was saturated. When the number of amorphous ribbon sheets exceeded eight, the charging efficiency intended to decrease.

Embodiment 10

The maximum charging efficiency by stories of the sheets to be laminated was measured by using the ribbon sheets of the inductance (magnetic permeability) of 15 μH and thus the results were shown in Table 5.

The maximum charging efficiency was obtained in a state of adjusting a time constant value of the receiver based on the inductance of the receiver of the wireless charger, that is, the secondary coil the secondary, and adjusting the efficiency to the maximum value.

TABLE 5

| | Maximum charging efficiency (%) | | | |
|---|---|---|---|---|
| Permeability | 1 sheet | 2 sheets | 3 sheets | 4 sheets |
| 15 μH | 61.3 | 68.7 | 71.1 | 71.9 |

With reference to Table 5, the efficiency increased with the number of ribbon sheets to be laminated, and the maximum charging efficiency was the highest as 71.9% in the case of 4 sheets.

As described above, in the present invention, the loss due to the eddy currents is significantly reduced by the flake treatment process of the ribbon, to thus block any magnetic field effects influenced upon a main body and a battery of a mobile terminal device and the quality factor (Q) of the secondary coil is increased, to thus obtain excellent power transmission efficiency.

In addition, gaps between fine pieces of a ribbon are filled with an adhesive by a compression laminating process after a flake treatment process of the ribbon, to thus prevent water penetration, and simultaneously the fine pieces are surrounded by the adhesive (or dielectric), to thus mutually isolate the fine pieces, to thereby promote the reduction in the eddy current and prevent shielding performance from falling.

In the above-described embodiments, the cases that the wireless charger is applied to the mobile terminal device has been described, but the present invention can be applied to all mobile electronic devices that provide a wireless charging function in a non-contact (wireless) system.

In the above-described embodiments, the cases that the magnetic field shield sheet is applied for the NFC and wireless charging function have been described, but it is also possible to use the NFC or wireless charging function alone. In addition, the composite sheet for shielding the magnetic field and the electromagnetic wave in addition to the magnetic field shield sheet can be applied for NFC and wireless charging.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

INDUSTRIAL APPLICABILITY

The present invention is applied in various portable electronic devices including a mobile terminal device, and can be applied to a composite sheet for shielding a magnetic field and electromagnetic waves to block an effect influenced upon the mobile terminal device by AC and DC magnetic fields generated when implementing NFC and the wireless charging in a non-contact (wireless) manner, and to help to absorb the electromagnetic waves necessary for the NFC and the wireless charging.

The invention claimed is:

1. A composite sheet for shielding a magnetic field and an electromagnetic wave, the composite sheet comprising:
   a magnetic sheet for shielding a magnetic field; and a conductor sheet for shielding an electromagnetic wave and radiating heat,
   wherein the magnetic sheet comprises: a ribbon sheet which is formed of an amorphous alloy or a nanocrystallized alloy and is separated into a plurality of pieces having gaps between the pieces; a protective film bonded to one side surface of the ribbon sheet; and an adhesive tape bonded to the other side surface of the ribbon sheet,
   wherein the conductor sheet is stacked on either the protective film or the adhesive tape, and
   wherein the protective film includes a first adhesive, the adhesive tape includes a second adhesive, and a portion of the first adhesive and a portion of the second adhesive are filled in the gaps.

2. The composite sheet according to claim 1, wherein the ribbon sheet includes a number of ribbon sheets which are stacked.

3. The composite sheet according to claim 1, wherein the conductor sheet is adhered to the protective film by an acrylic adhesive or a double-sided tape, the acrylic adhesive comprising an Ag powder or a Ni powder in a range of 10 to 30 volume % with respect to a total volume of the acrylic adhesive.

4. The composite sheet according to claim 1, wherein the conductor sheet is made of a metal foil or a metal film.

5. A composite sheet for shielding a magnetic field and an electromagnetic wave, the composite sheet comprising:
   a first magnetic sheet having a first permeability and formed of an amorphous alloy or a nanocrystallined alloy; and
   a second magnetic sheet having a second permeability lower than the first permeability,
   wherein the first magnetic sheet is divided into a number of pieces having gaps between the pieces, a protective film is laminated on one side surface of the first magnetic sheet, and a double-sided tape is laminated on the other side surface of the first magnetic sheet, and
   wherein the protective film includes a first adhesive, the double-sided tape includes a second adhesive, and a portion of the first adhesive and a portion of the second adhesive are filled in the gaps.

6. The composite sheet according to claim 5, wherein the second magnetic sheet is formed of a polymer sheet made of a magnetic powder and a resin.

7. The composite sheet according to claim 5, wherein the second magnetic sheet is formed of a ferrite sheet.

8. A composite sheet for shielding a magnetic field and an electromagnetic wave, the composite sheet comprising:
   a first magnetic sheet having a first permeability and formed of an amorphous alloy or a nanocrystallized alloy; and
   a second magnetic sheet having a second permeability lower than the first permeability,
   wherein the first magnetic sheet is divided into a number of pieces having gaps between the pieces, a protective film is laminated on one side surface of the first magnetic sheet and a double-sided tape is laminated on the other side surface of the first magnetic sheet,
   wherein the protective film includes a first adhesive, the double-sided tape includes a second adhesive, and a portion of the first adhesive and a portion of the second adhesive are filled in the gaps, and
   wherein the first magnetic sheet is arranged in a predetermined area in a center portion of the composite sheet, and the second magnetic sheet is annularly formed to surround the first magnetic sheet.

9. The composite sheet according to claim 5, further comprising a conductor sheet formed of a conductive metal film on the protective film and having an electromagnetic wave shielding function and a heat-radiation function.

10. The composite sheet according to claim 5, wherein the composite sheet for shielding a magnetic field and an electromagnetic wave is applied to a receiver of a wireless charger, and wherein the magnetic sheets are made of a Fe-based amorphous alloy that is heat treated under no magnetic field at a temperature of 300° C. to 600° C. for 30 minutes to 2 hours, or a nanocrystalline alloy that is heat treated under no magnetic field at a temperature of 300° C. to 700° C. for 30 minutes to 2 hours.

11. An antenna module comprising:
    an NFC (Near Field Communication) antenna made of a loop antenna on a substrate for transmitting and receiving an NFC signal; and
    a composite sheet according to claim 1 that is laminated on the substrate.

12. An antenna module comprising:
    a dual-antenna including a wireless-charging secondary coil that is formed in a loop form on an inner side of a substrate and that receives a wireless-charging high frequency power signal transmitted from a transmitter of a wireless charger, and an NFC (Near Field Communication) antenna coil that is formed of a loop form on an outside of the substrate, and that transmits and receives an NFC high frequency signal; and
    a composite sheet according to claim 1 that is laminated on the substrate.

13. The antenna module according to claim 12, wherein the composite sheet is extended, and a DC-DC converter circuit for converting the high-frequency power signal into a direct-current (DC) signal for DC level conversion is mounted in a region extended from the composite sheet.

14. The antenna module according to claim 12, wherein the composite sheet employs 1 to 12 layers of amorphous ribbon sheets.

15. An antenna module comprising:
    an NFC and wireless-charging antenna including a single coil that is formed in a spiral pattern on a surface of a substrate and first to third terminal blocks extended from the coil, and that transmits and receives an NFC high frequency signal between the first terminal block and the second terminal block and that receives a wireless-charging high-frequency signal transmitted from a transmitter of a wireless charger between the third terminal block and the first or second terminal block; and
    a composite sheet according to claim 1 that is laminated on the substrate.

* * * * *